United States Patent
Akai et al.

(10) Patent No.: US 11,702,557 B2
(45) Date of Patent: Jul. 18, 2023

(54) INK COMPOSITION FOR MANUFACTURING ORGANIC SEMICONDUCTOR DEVICE

(71) Applicant: DAICEL CORPORATION, Osaka (JP)

(72) Inventors: Yasuyuki Akai, Tokyo (JP); Takeshi Yokoo, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 47 days.

(21) Appl. No.: 17/271,096

(22) PCT Filed: Sep. 12, 2019

(86) PCT No.: PCT/JP2019/035857
§ 371 (c)(1),
(2) Date: Feb. 24, 2021

(87) PCT Pub. No.: WO2020/059626
PCT Pub. Date: Mar. 26, 2020

(65) Prior Publication Data
US 2021/0246325 A1    Aug. 12, 2021

(30) Foreign Application Priority Data
Sep. 19, 2018 (JP) ................................ 2018-174905

(51) Int. Cl.
*C09D 11/36* (2014.01)
*C09D 11/033* (2014.01)
(Continued)

(52) U.S. Cl.
CPC ............ *C09D 11/36* (2013.01); *C09D 11/033* (2013.01); *H10K 85/615* (2023.02);
(Continued)

(58) Field of Classification Search
CPC .................................................... C09D 11/36
See application file for complete search history.

(56) References Cited

U.S. PATENT DOCUMENTS 9,853,225 B2   12/2017   Takeya et al.
2014/0230900 A1*   8/2014   Cull .................... H01L 51/0036
252/500
(Continued)

FOREIGN PATENT DOCUMENTS

EP    3 153 556 A1    4/2017
JP    2009-81424 A    4/2009
(Continued)

OTHER PUBLICATIONS

Written Opinion of the International Searching Authority and International Search Report, dated Dec. 3, 2019, for International Application No. PCT/JP2019/035857, with English translations.
(Continued)

*Primary Examiner* — William D Young
(74) *Attorney, Agent, or Firm* — Birch, Stewart, Kolasch & Birch, LLP

(57) ABSTRACT

An object of the present invention is to provide an ink composition for manufacturing an organic semiconductor device, the ink composition allowing an organic semiconductor material with a rigid main chain into an ink having an optimal solute concentration for a single-crystal formation process. The present invention provides an ink composition for manufacturing an organic semiconductor device, the ink composition including at least one solvent selected from Naphthalene Compound (A) and at least one solute. The isomer content of Naphthalene Compound (A) is preferably 2% or less in terms of a percentage for peak area with Naphthalene Compound (A) being 100% in gas chromatography. Naphthalene Compound (A): a compound represented by Formula (a), where in Formula (a), R is as defined in the description.

7 Claims, 2 Drawing Sheets

(51) Int. Cl.
*H10K 85/60* (2023.01)
*H10K 10/46* (2023.01)
*H10K 71/12* (2023.01)
*H10K 71/80* (2023.01)
*H10K 77/10* (2023.01)

(52) U.S. Cl.
CPC ....... *H10K 85/6572* (2023.02); *H10K 10/466* (2023.02); *H10K 10/488* (2023.02); *H10K 71/12* (2023.02); *H10K 71/80* (2023.02); *H10K 77/111* (2023.02)

(56) References Cited

U.S. PATENT DOCUMENTS

| | | |
|---|---|---|
| 2016/0013425 A1 | 1/2016 | Takeya et al. |
| 2017/0117472 A1 | 4/2017 | Hongo |
| 2017/0170399 A1 | 6/2017 | Masui et al. |
| 2017/0237012 A1 | 8/2017 | Shen et al. |
| 2019/0131546 A1 | 5/2019 | Fukuzaki et al. |

FOREIGN PATENT DOCUMENTS

| | | |
|---|---|---|
| JP | 2015/185620 A | 10/2015 |
| JP | 2015-197395 A | 10/2015 |
| JP | 2016-92056 A | 5/2016 |
| JP | 2018-6745 A | 1/2018 |
| WO | WO 2013/029733 A1 | 3/2013 |
| WO | WO 2014/136827 A1 | 9/2014 |

OTHER PUBLICATIONS

Extended European Search Report dated May 20, 2022, in European Patent Application No. 19863021.2.

\* cited by examiner

INK COMPOSITION FOR MANUFACTURING ORGANIC SEMICONDUCTOR DEVICE

TECHNICAL FIELD

The present invention relates to an ink composition for manufacturing an organic semiconductor device. More specifically, the present invention relates to an ink composition used for manufacturing an organic semiconductor device by a coating film forming method including a printing method. The present application claims priority from the Japanese Patent Application No. 2018-174905 filed in Japan on Sep. 19, 2018, the contents of which are incorporated herein.

BACKGROUND ART

In recent years, organic semiconductors, oxide semiconductors, micro crystal silicon semiconductors, solution-coatable low temperature polysilicon semiconductors, and the like have been studied and developed as candidates for the next-generation thin-film active elements. Furthermore, in an effort to prepare for the early stage of market launch for flexible substrate devices, there have been many developments regarding Flexible Hybrid Electronics (FHE), which combines printed electronics technologies using organic electronics materials with, for the parts that require high performance, existing semiconductor and MEMS technologies.

Organic semiconductors, which have been expected to have a central role to printed electronics technologies, have superior characteristics compared to other semiconductor materials in the manufacture of elements using flexible substrates. For example, organic semiconductors have high mechanical strength against bending and can be formed by a low temperature process and coating method. Therefore, research and development of organic semiconductor materials and devices for practical applications are being actively carried out. In particular, organic single-crystal semiconductor films which enable high performance organic semiconductor devices have been receiving attention, with an edge-casting method and a continuous edge-casting method being proposed as techniques for manufacturing the same (see Patent Document 1). Furthermore, proposed semiconductor materials which can be formed into a high-performance organic single-crystal semiconductor by an edge-casting method or a continuous edge-casting method include: a chalcogen-containing organic compound that functions as a p-type semiconductor (see Patent Document 2); and an organic compound having a perylene bisimide skeleton exemplified by perylene diimides (PDIs) that function as n-type semiconductors (see Patent Document 3).

CITATION LIST

Patent Document

Patent Document 1: JP 2015-185620 A
Patent Document 2: WO 2014/136827
Patent Document 3: JP 2018-006745 A

SUMMARY OF INVENTION

Technical Problem

The low molecular weight organic single-crystal semiconductor materials proposed above have a condensed ring skeleton with highly conjugated 7E electrons; due to this rigid main chain structure, the low molecular weight organic single-crystal semiconductor materials proposed have very low solubility in solvents, making it very difficult to produce an ink composition for forming high-quality organic single-crystal semiconductors. Therefore, such organic semiconductor materials are used in manufacturing methods especially in vapor deposition process; as for organic semiconductor devices formed by a solution coating method, organic semiconductor materials having relatively high solubility are adopted, with examples being: derivatives, such as benzothienobenzothiophene derivatives (Cn-BTBT, 2,7-dialkyl[1]benzothiophene[3,2-b][1] benzothiophenes) and TIPS-Pentacene (6,13-Bis(triisopropyl-silylthynyl)pentacene) with highly soluble substituents; and tetrabenzoporphyrin precursors. However, compared with chalcogen-containing organic compounds having a rigid main chain or organic semiconductor materials having a perylene bisimide skeleton, these derivatives and precursors lack electrical properties typified by field effect mobility and chemical stability, and thus they have not been put into full-scale practical use as organic semiconductor devices.

It is also important to grow large single crystals to reduce grain boundaries, which is the interface present between crystal grains, when forming an organic single-crystal semiconductor. In other words, when there are many grain boundaries in the elements when forming an organic single-crystal semiconductor, hopping conduction is more likely to occur instead of band conduction, greatly reducing the field effect mobility (also known as carrier mobility), an indicator of semiconductor performance. Especially, when producing a device that combines a large number of organic semiconductor elements industrially, a large number of grain boundaries leads to reduced performance and instable operation of the device, which in turn translate to a higher defective rate of organic semiconductor elements and a lower production efficiency.

In light of such circumstances, an object of the present invention is to provide an ink composition for manufacturing an organic semiconductor device, the ink composition allowing an organic semiconductor material with a rigid main chain into an ink having an optimal solute concentration for a single crystal formation process.

Furthermore, another object of the present invention is to provide an ink composition for manufacturing an organic semiconductor device, the ink composition allowing to form a high-performance organic single-crystal semiconductor element with few grain boundaries.

Solution to Problem

As a result of diligent research to solve the problems described above, the inventors of the present invention found that the solubility of an organic semiconductor material having a rigid main chain in a specific naphthalene compound is relatively high, and such naphthalene compound is suitable as a solvent that allows the organic semiconductor material having a rigid main chain into an ink having an optimal solute concentration for a single-crystal formation process. Furthermore, it was found that by reducing the isomer content of the naphthalene compound described above, large single crystals can be grown to form organic single-crystal semiconductor elements with few grain boundaries. The present invention was completed based on these findings.

That is, the present invention provides an ink composition for manufacturing an organic semiconductor device, the ink composition containing at least one solvent selected from Naphthalene Compound (A) below and at least one solute:

Naphthalene Compound (A): a compound represented by Formula (a):

[Chem. 1]

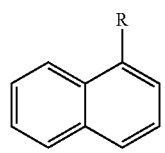

(a)

where in Formula (a), R represents a hydrogen atom, a halogen atom, a $C_{1-20}$ alkyl group which may have a substituent selected from Group 1, a $C_{2-22}$ alkenyl group which may have a substituent selected from Group 1, a $C_{2-22}$ alkynyl group which may have a substituent selected from Group 1, a $C_{1-20}$ alkoxy group which may have a substituent selected from Group 1, a $C_{1-20}$ alkylthio group which may have a substituent selected from Group 1, a $C_{2-20}$ alkylcarbonyl group which may have a substituent selected from Group 1, a $C_{2-20}$ alkoxycarbonyl group which may have a substituent selected from Group 1, a di- or mono-$C_{1-20}$ alkylamino group which may have a substituent selected from Group 1, a $C_{6-20}$ aryl group which may have a substituent selected from Group 2, a monovalent heterocyclic group which may have a substituent selected from Group 2, or a $C_{3-20}$ cycloalkyl group which may have a substituent selected from Group 2;

Group 1 mentioned above includes a halogen atom, a sulfonyl group, a hydroxy group, an aldehyde group (—CHO), a carbonyl group, a carboxyl group, a nitro group, an amino group, a sulfo group (—$SO_3H$), an ether group, a $C_{1-20}$ alkylthio group, a di- or mono-$C_{1-20}$ alkylamino group, a $C_{6-20}$ aryl group, a monovalent heterocyclic group, and a $C_{3-20}$ substituted silyl group; and Group 2 mentioned above includes a substituent selected from Group 1, a $C_{1-20}$ alkyl group which may have a substituent selected from Group 1, a $C_{2-20}$ alkenyl group which may have a substituent selected from Group 1, and a $C_{2-20}$ alkynyl group which may have a substituent selected from Group 1.

In the aforementioned ink composition for manufacturing an organic semiconductor device, R is preferably a halogen atom or a $C_{1-20}$ alkyl group which may have a substituent selected from Group 1.

In the aforementioned ink composition for manufacturing an organic semiconductor device, Naphthalene Compound (A) is preferably at least one selected from the group consisting of 1-chloronaphthalene and 1-methylnaphthalene.

In the aforementioned ink composition for manufacturing an organic semiconductor device, the isomer content of Naphthalene Compound (A) is preferably 2% or less in terms of a percentage for peak area with Naphthalene Compound (A) being 100% in gas chromatography.

In the aforementioned ink composition for manufacturing an organic semiconductor device, the solute may be an organic semiconductor material.

In the aforementioned ink composition for manufacturing an organic semiconductor device, the solute may be an n-type organic semiconductor material.

The aforementioned ink composition for manufacturing an organic semiconductor device may further include a macromolecular compound as a second component in addition to the solute.

The aforementioned ink composition for manufacturing an organic semiconductor device may be used for producing an organic single-crystal semiconductor film by a drop-casting method, an inkjet printing method, an edge-casting method, or a continuous edge-casting method.

Advantageous Effects of Invention

Because the ink composition for manufacturing an organic semiconductor device according to an embodiment of the present invention has the configuration described above, ink concentration can be achieved in a temperature range in which the coating process is possible even when an organic semiconductor material having a rigid main chain is used. Furthermore, by reducing the isomer content of the naphthalene compound to be in the aforementioned range, large single crystals can be grown to efficiently form high-performance organic single-crystal semiconductor elements with few grain boundaries, and organic single-crystal semiconductor films with high reliability can be efficiently formed at a low cost. Also, since coating process becomes possible, an organic single-crystal semiconductor film with high uniformity over a large area can be formed. Therefore, an unprecedentedly high-performance flexible device can be provided at a high efficiency and a low cost via an organic thin-film transistor.

Specifically, forming an organic single-crystal semiconductor by a drop-casting method, an inkjet printing method, an edge-casting method, or a continuous edge-casting method using the ink composition for manufacturing an organic semiconductor device according to an embodiment of the present invention enables to provide a flexible device with a high-performance organic CMOS circuit that combines a p-type transistor having a field effect mobility µp of 10 [$cm^2/Vs$] or greater and an n-type transistor having a field effect mobility µn in of 0.1 [$cm^2/Vs$] or greater.

DESCRIPTION OF EMBODIMENTS

Figure 1:
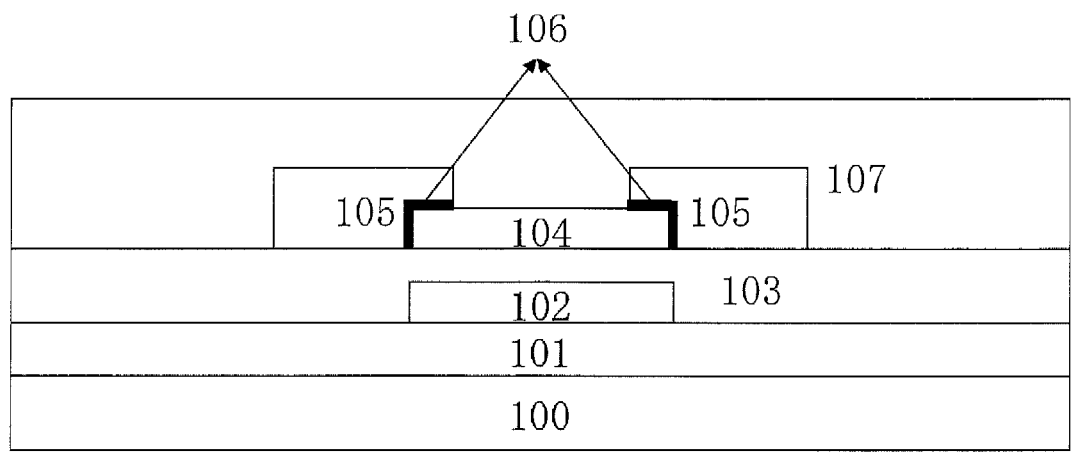
FIG. 1 is a schematic diagram of a cross-sectional structure of an example of an organic thin-film transistor.

Ink composition for manufacturing organic semiconductor device

An ink composition for manufacturing an organic semiconductor device according to an embodiment of the present invention (hereinafter may simply be referred to as the "ink composition according to an embodiment of the present invention") contains at least one solvent selected from Naphthalene Compound (A) below and at least one solute:

Naphthalene Compound (A): a compound represented by Formula (a):

[Chem. 2]

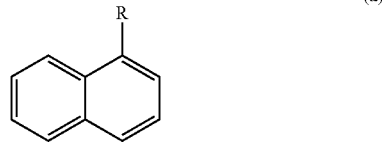

(a)

where in Formula (a), R represents a hydrogen atom, a halogen atom, a $C_{1-20}$ alkyl group which may have a substituent selected from Group 1, a $C_{2-22}$ alkenyl group which may have a substituent selected from Group 1, a $C_{2-22}$ alkynyl group which may have a substituent selected from Group 1, a $C_{1-20}$ alkoxy group which may have a substituent selected from Group 1, a $C_{1-20}$ alkylthio group which may have a substituent selected from Group 1, a $C_{2-20}$ alkylcarbonyl group which may have a substituent selected from Group 1, a $C_{2-20}$ alkoxycarbonyl group which may have a substituent selected from Group 1, a di- or mono-$C_{1-20}$ alkylamino group which may have a substituent selected from Group 1, a $C_{6-20}$ aryl group which may have a substituent selected from Group 2, a monovalent heterocyclic group which may have a substituent selected from Group 2, or a $C_{3-20}$ cycloalkyl group which may have a substituent selected from Group 2;

Group 1 mentioned above includes a halogen atom, a sulfonyl group, a hydroxy group, an aldehyde group (—CHO), a carbonyl group, a carboxyl group, a nitro group, an amino group, a sulfo group (—$SO_3H$), an ether group, a $C_{1-20}$ alkylthio group, a di- or mono-$C_{1-20}$ alkylamino group, a $C_{6-20}$ aryl group, a monovalent heterocyclic group, and a $C_{3-20}$ substituted silyl group; and Group 2 mentioned above includes a substituent selected from Group 1, a $C_{1-20}$ alkyl group which may have a substituent selected from Group 1, a $C_{2-20}$ alkenyl group which may have a substituent selected from Group 1, and a $C_{2-20}$ alkynyl group which may have a substituent selected from Group 1.

Naphthalene Compound (A)

The ink composition according to an embodiment of the present invention contains, as a solvent, at least one selected from Naphthalene Compound (A), which is a compound represented by Formula (A). An organic semiconductor material having a rigid main chain exhibits relatively high solubility in Naphthalene Compound (A), making Naphthalene Compound (A) suitable as a solvent that allows the organic semiconductor material into an ink having an optimal solute concentration for a single-crystal formation process. The ink composition according to an embodiment of the present invention may contain only one Naphthalene Compound (A), or two or more Naphthalene Compound(s) (A).

In Formula (a), R represents a hydrogen atom, a halogen atom, a $C_{1-20}$ alkyl group which may have a substituent selected from Group 1, a $C_{2-22}$ alkenyl group which may have a substituent selected from Group 1, a $C_{2-22}$ alkynyl group which may have a substituent selected from Group 1, a $C_{1-20}$ alkoxy group which may have a substituent selected from Group 1, a $C_{1-20}$ alkylthio group which may have a substituent selected from Group 1, a $C_{2-20}$ alkylcarbonyl group which may have a substituent selected from Group 1, a $C_{2-20}$ alkoxycarbonyl group which may have a substituent selected from Group 1, a di- or mono-$C_{1-20}$ alkylamino group which may have a substituent selected from Group 1, a $C_{6-20}$ aryl group which may have a substituent selected from Group 2, a monovalent heterocyclic group which may have a substituent selected from Group 2, or a $C_{3-20}$ cycloalkyl group which may have a substituent selected from Group 2.

Examples of the halogen atom described above include a fluorine atom, a chlorine atom, a bromine atom, and an iodine atom. Of these, a fluorine atom and a chlorine atom are preferable.

Examples of the $C_{1-20}$ alkyl group include straight-chain or branched-chain alkyl groups having from 1 to 20 carbons, such as a methyl group, an ethyl group, an n-propyl group, an isopropyl group, an n-butyl group, an isobutyl group, a sec-butyl group, a tert-butyl group, an n-pentyl group, an isopentyl group, a neopentyl group, a tert-pentyl group, an n-hexyl group, an isohexyl group, a heptyl group, an octyl group, an nonyl group, and a decyl group.

Examples of the $C_{2-22}$ alkenyl group include straight-chain or branched-chain alkenyl groups having from 2 to 22 carbons, such as vinyl, 1-propenyl, 2-propenyl, 2-methyl-1-propenyl, 1-butenyl, 2-butenyl, 3-butenyl, 3-methyl-2-butenyl, 1-pentenyl, 2-pentenyl, 3-pentenyl, 4-pentenyl, 4-methyl-3-pentenyl, 1-hexenyl, 3-hexenyl, 5-hexenyl, 1-heptenyl, 1-octenyl, 1-nonenyl, and 1-decenyl.

Examples of the $C_{2-22}$ alkynyl group include straight-chain or branched-chain alkynyl groups having from 2 to 22 carbons, such as ethynyl, 1-propynyl, 2-propynyl, 1-butynyl, 2-butynyl, 3-butynyl, 1-pentynyl, 2-pentynyl, 3-pentynyl, 4-pentynyl, 1-hexynyl, 2-hexynyl, 3-hexynyl, 4-hexynyl, 5-hexynyl, 1-heptynyl, 1-octynyl, 1-nonynyl, and 1-decynyl.

Examples of the $C_{1-20}$ alkoxy group include straight-chain or branched-chain alkoxy groups having from 1 to 20 carbons, such as a methoxy group, an ethoxy group, an n-propoxy group, an isopropoxy group, an n-butoxy group, an isobutoxy group, a sec-butoxy group, a tert-butoxy group, an n-pentyloxy group, an isopentyloxy group, a neopentyloxy group, a tert-pentyloxy group, an n-hexyloxy group, an isohexyloxy group, a heptyloxy group, an octyloxy group, a nonyloxy group, and a decyloxy group.

Examples of the $C_{1-20}$ alkylthio group include straight-chain or branched-chain alkylthio groups having from 1 to 20 carbons, such as a methylthio group, an ethylthio group, an n-propylthio group, an isopropylthio group, an n-butylthio group, an isobutylthio group, a sec-butylthio group, a tert-butylthio group, an n-pentylthio group, an isopentylthio group, a neopentylthio group, a tert-pentylthio group, an n-hexylthio group, an isohexylthio group, a heptylthio group, an octylthio group, a nonylthio group, and a decylthio group.

Examples of the $C_{2-20}$ alkylcarbonyl group include straight-chain or branched-chain alkylcarbonyl groups having from 2 to 20 carbons, such as an acetyl group, a propionyl group, an n-butyryl group, an isobutyryl group, an n-butylcarbonyl group, an isobutylcarbonyl group, a sec-butylcarbonyl group, a tert-butylcarbonyl group, an n-pentylcarbonyl group, an isopentylcarbonyl group, a neopentylcarbonyl group, a tert-pentylcarbonyl group, an n-hexylcarbonyl group, an isohexylcarbonyl group, a heptylcarbonyl group, an octylcarbonyl group, a nonylcarbonyl group, and a decylcarbonyl group.

Examples of the $C_{2-20}$ alkoxycarbonyl group include straight-chain or branched-chain alkoxycarbonyl groups having from 2 to 20 carbons, such as a methoxycarbonyl group, an ethoxycarbonyl group, an n-propoxycarbonyl group, an isopropoxycarbonyl group, an n-butoxycarbonyl group, an isobutoxycarbonyl group, a sec-butoxycarbonyl group, a tert-butoxycarbonyl group, an n-pentyloxycarbonyl group, an isopentyloxycarbonyl group, a neopentyloxycarbonyl group, a tert-pentyloxycarbonyl group, an n-hexyloxycarbonyl group, an isohexyloxycarbonyl group, an heptyloxycarbonyl group, an octyloxycarbonyl group, a nonyloxycarbonyl group, and a decyloxycarbonyl group.

Examples of the di- or mono-$C_{1-20}$ alkylamino group include amino groups mono- or di-substituted with the $C_{1-20}$ alkyl groups mentioned above, such as a methylamino group, an ethylamino group, a propylamino group, an isopropylamino group, a butylamino group, an isobutylamino group, a tert-butylamino group, an N,N-dimethylamino group, an N,N-diethylamino group, an N,N-dipropylamino group, an N,N-diisopropylamino group, an N,N-dibutylamino group, an N,N-diisobutylamino group, an N,N-di-tert-butylamino group, and an N-methyl-N-ethylamino group.

Examples of the $C_{6-20}$ aryl group include aryl groups having from 6 to 20 carbons, such as a phenyl group, a naphthyl group, an anthryl group, a phenanthryl group, an acenaphthalenyl group, and a biphenylyl group.

Examples of the monovalent heterocyclic group include from 5- to 20-membered, preferably 5- or 6-membered, aromatic heterocyclic groups or non-aromatic heterocyclic groups having in the ring a carbon atom and from 1 to 4 heteroatoms selected from an oxygen atom, a sulfur atom and a nitrogen atom.

Examples of the aromatic heterocyclic group include: monocyclic aromatic heterocyclic groups, such as a furyl group, a thienyl group, a pyridyl group, a pyrrolyl group, an imidazolyl group, a pyrazolyl group, an a thiazolyl group; and fused aromatic heterocyclic groups such as a quinolyl group and isoquinololyl.

Examples of the non-aromatic heterocyclic group include: monocyclic non-aromatic heterocyclic groups, such as a piperidyl group, a morpholinyl group, a piperazinyl group, and a tetrahydrofuryl group; and fused non-aromatic heterocyclic groups, such as a chromenyl group, a tetrahydroquinolinyl group, and a tetrahydroisoquinolinyl group.

Examples of the $C_{3-20}$ cycloalkyl group include cyclic alkyl groups having from 3 to 20 carbons, such as a cyclopropyl group, a cyclobutyl group, a cyclopentyl group, a cyclohexyl group, a cycloheptyl group, a cyclooctyl group, a cyclononyl group, and a cyclodecyl group.

Examples of the sulfonyl group include a $C_{1-20}$ alkylsulfonyl group and a $C_{6-20}$ arylsulfonyl group.

Examples of the $C_{1-20}$ alkylsulfonyl group include straight-chain or branched-chain alkylsulfonyl groups having from 1 to 20 carbons, such as a methylsulfonyl group, an ethylsulfonyl group, an n-propylsulfonyl group, an isopropylsulfonyl group, an n-butylsulfonyl group, an isobutylsulfonyl group, a sec-butylsulfonyl group, a tert-butylsulfonyl group, an n-pentylsulfonyl group, an isopentylsulfonyl group, a neopentylsulfonyl group, a tert-pentylsulfonyl group, an n-hexylsulfonyl group, an isohexylsulfonyl group, a heptylsulfonyl group, an octylsulfonyl group, an nonylsulfonyl group, and a decylsulfonyl group.

Examples of the $C_{6-20}$ arylsulfonyl group include arylsulfonyl groups having from 6 to 20 carbons, such as a phenylsulfonyl group, a naphthylsulfonyl group, an anthrylsulfonyl group, a phenanthrylsulfonyl group, an acenaphthylenylsulfonyl group, and a biphenylylsulfonyl group.

Examples of the carbonyl group include the above-mentioned $C_{2-20}$ alkylcarbonyl group, the above-mentioned $C_{2-20}$ alkoxycarbonyl group, and a $C_{7-20}$ arylcarbonyl group.

Examples of the $C_{7-20}$ arylcarbonyl group include arylcarbonyl groups having from 7 to 20 carbons, such as a benzoyl group, a naphthylcarbonyl group, an anthrylcarbonyl group, a phenanthrylcarbonyl group, an acenaphthylenylcarbonyl group, and a biphenylylcarbonyl group.

Examples of the ether group include the above-mentioned $C_{1-20}$ alkoxy group and a $C_{6-20}$ aryloxy group.

Examples of the $C_{6-20}$ aryloxy group include aryloxy groups having from 6 to 20 carbons, such as a phenoxy group, a naphthyloxy group, an anthryloxy group, a phenanthryloxy group, an acenaphthylenyloxy group, and a biphenylyloxy group.

Examples of the $C_{3-20}$ substituted silyl group include silyl groups having from 1 to 3, preferably 3, substituents selected from the above-mentioned $C_{1-20}$ alkyl groups and the above-mentioned $C_{6-20}$ aryl groups, such as a trimethylsilyl group, a triethylsilyl group, a tert-butyldimethylsilyl group, a tert-butyldiphenylsilyl group, and a triisopropylsilyl group.

The $C_{1-20}$ alkyl group, $C_{2-22}$ alkenyl group, $C_{2-22}$ alkynyl group, $C_{1-20}$ alkoxy group, $C_{1-20}$ alkylthio group, $C_{2-20}$ alkylcarbonyl group, $C_{2-20}$ alkoxycarbonyl group, and di- or mono-$C_{1-20}$ alkylamino group descried above may have a substituent selected from Group 1 above, while the $C_{6-20}$ aryl group, monovalent heterocyclic group, and $C_{3-20}$ cycloalkyl group may have a substituent selected from Group 2 above. The number of substituents is not limited, but is preferably from 1 to 3. When two or more of the above substituents are contained, the two or more substituents may be the same or different.

From the perspective of solubility of the solute in Naphthalene Compound (A) and availability of the solute, R is preferably a halogen atom, a $C_{1-20}$ alkyl group which may have a substituent selected from Group 1, or a $C_{1-20}$ alkoxy group which may have a substituent selected from the Group 1, more preferably a halogen atom, a $C_{1-20}$ alkyl group, or a $C_{1-20}$ alkoxy group, even more preferably a fluorine atom, a chlorine atom, a $C_{1-6}$ alkyl group (such as a methyl group or an ethyl group), or a $C_{1-6}$ alkoxy group (such as a methoxy group or an ethoxy group), and particularly preferably a $C_{1-6}$ alkyl group (particularly a methyl group) or a chlorine atom.

Generally, a naphthalene compound is obtained as a byproduct of crude oil refining and is fractionated into different compounds mainly by distillation and further derivatized. Because the structural isomers of naphthalene compounds have very similar physical properties, it is difficult to separate the structural isomers from naphthalene compounds even in fractional distillation and derivatization. Therefore, industrially distributed naphthalene compounds contain a few percent of isomers. Naphthalene Compound (A) is not limited, but the isomer content of Naphthalene Compound (A) as a percentage for peak area with Naphthalene Compound (A) being 100% in gas chromatography is preferably 2% or less, more preferably 1.8% or less, even more preferably 1.5% or less, yet even more preferably 1.2% or less, further preferably 1% or less, and particularly preferably 0.8% or less. By using Naphthalene Compound (A) having an isomer content of 2% or less as the solvent for the ink composition according to an embodiment of the present invention, it becomes easier to grow large single crystals and more likely to produce a semiconductor device having a high-performance organic single-crystal semiconductor element with few grain boundaries.

The isomer of Naphthalene Compound (A) is not limited, but examples include positional isomers which are isomers that are difficult to be separated from Naphthalene Compound (A), and specific examples include Naphthalene Compound

[Chem. 3]

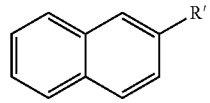
(a')

In Formula (a'), R' takes the same as R in Formula (a) above. Naphthalene Compound (A) is a 1-substituent (α-substituent) while Naphthalene Compound (A') is a 2-substituent (β-substituent), both having extremely similar physical properties such as boiling point; although it is difficult to completely separate the two by methods such as distillation, the Naphthalene Compound (A') content can be reduced by performing a known precision distillation, such as one using an Oldershaw distillation apparatus.

Although it is unclear why large single crystals grow and the grain boundaries decrease when the isomer content of Naphthalene Compound (A) is reduced, the mechanism can be deduced as follows. The 1-substitution (α-substituent) has a substituent in the vertical direction with respect to the plane of the naphthalene ring (a direction), so it does not easily crystallize and generally tends to become liquid at room temperature (for example, the melting point of 1-methylnaphthalene is −22° C. and melting point of 1-chloronaphthalene is −2.5° C.); meanwhile, the 2-substituent (β-substituent) has a substituent in the direction that is parallel to the plane of the naphthalene ring (β direction), so it tends to crystallize and generally tends to become solid at room temperature (for example, the melting point of 2-methylnaphthalene is 34° C. and the melting point of 2-chloronaphthalene is 59.5° C.). It is inferred that the solid component of the 2-substituent is formed during the crystal growth process in the drying step, which brings about the adverse effect. However, this mechanism is purely hypothesized and does not limit the scope of the present invention.

The isomer content of Naphthalene Compound (A) can be measured as a percentage for peak area by gas chromatography. The measurement conditions of gas chromatography are not limited as long as Naphthalene Compound (A) can be separated the isomers; for example, the conditions described in the examples below can be adopted.

The molecular weight of Naphthalene Compound (A) is not limited, but may be, for example, approximately 250 or less, preferably from 128 to 200, particularly preferably from 130 to 180. When the molecular weight of Naphthalene Compound (A) is greater than 250, Naphthalene Compound (A) is less likely to evaporate, and production efficiency of the organic single-crystal semiconductor may decrease.

The boiling point of Naphthalene Compound (A) is not limited, but may be, for example, approximately 300° C. or lower, preferably from 200 to 300° C., and particularly preferably from 210 to 280° C. When the boiling point of Naphthalene Compound (A) is greater than 300° C., Naphthalene Compound (A) is less likely to evaporate, and production efficiency of the organic single-crystal semiconductor may decrease.

The SP value of Naphthalene Compound (A) by the Fedors method at 25° C. may be, for example, from 7.0 to 12.0 [(cal/cm$^3$)$^{0.5}$], preferably from 8.0 to 12.0 [(cal/cm$^3$)$^{0.5}$], particularly preferably from 9.0 to 11.5 [(cal/cm$^3$)$^{0.5}$]. Note that the SP value by the Fedors method is a value calculated by the method described in Polym. Eng. Sci., 14[2], 147-154 (1974).

Preferred examples of Naphthalene Compound (A) include 1-naphthalene acetate, 1-naphthalene methanol, 1-naphthalene ethanol, 1-vinylnaphthalene, 1-methylnaphthalene, 1-ethylnaphthalene, 1-fluoronaphthalene, 1-chloronaphthalene, 1-bromonaphthalene, 1-iodonaphthalene, 1-methoxynaphthalene, 1-ethoxynaphthalene, 1-(chloromethyl)naphthalene, 1-(2-bromoethyl)naphthalene, 1-acetylnaphthalene, 1-(aminomethyl)naphthalene, and 1-(trifluoromethyl)naphthalene; these compounds can be used alone or in a combination of two or more. Among these, from the perspective of solubility of the organic semiconductor material and film forming properties of the organic single-crystal semiconductor, 1-chloronaphthalene, 1-methylnaphthalene, 1-ethylnaphthalene, 1-fluoronaphthalene, and 1-methoxynaphthalene are preferable, 1-chloronaphthalene, 1-methylnaphthalene, 1-fluoronaphthalene, and 1-methoxynaphthalene are more preferable, and 1-chloronaphthalene, 1-methylnaphthalene, and 1-methoxynaphthalene are even more preferable; meanwhile, from the perspective of allowing single crystals to grow large and reducing the grain boundaries, 1-chloronaphthalene and 1-methylnaphthalene are particularly preferable.

The ink composition according to an embodiment of the present invention may contain a solvent other than Naphthalene Compound (A) (other solvent). The other solvent described above is generally a solvent used in electronic material applications, such as a solvent that is compatible with Naphthalene Compound (A). One or two other solvents may be contained.

The content ratio of Naphthalene Compound (A) (the combined amount if two or more types are used in combination) in the total amount (100 wt. %) of the solvent contained in the ink composition according to an embodiment of the present invention may be, for example, 50 wt. % or more (such as from 50 to 100 wt. %), preferably 70 wt. % or more (such as from 70 to 100 wt. %), particularly preferably 80 wt. % or more (such as from 80 to 100 wt. %). When the content of Naphthalene Compound (A) is below the above range, the solubility of the organic semiconductor material tends to decrease.

Solute

The solute contained in the ink composition according to an embodiment of the present invention is not limited, but is preferably an organic semiconductor material.

The organic semiconductor material is not limited, and a known organic semiconductor material can be used, such as a p-type organic semiconductor material or an n-type organic semiconductor material.

From the perspective of field effect mobility and the like, the p-type organic semiconductor material as the solute contained in the ink composition according to an embodiment of the present invention is preferably a compound having a rigid main chain, such as compounds represented by Formula (1-1) below and compounds represented by Formula (1-2) below:

[Chem. 4]

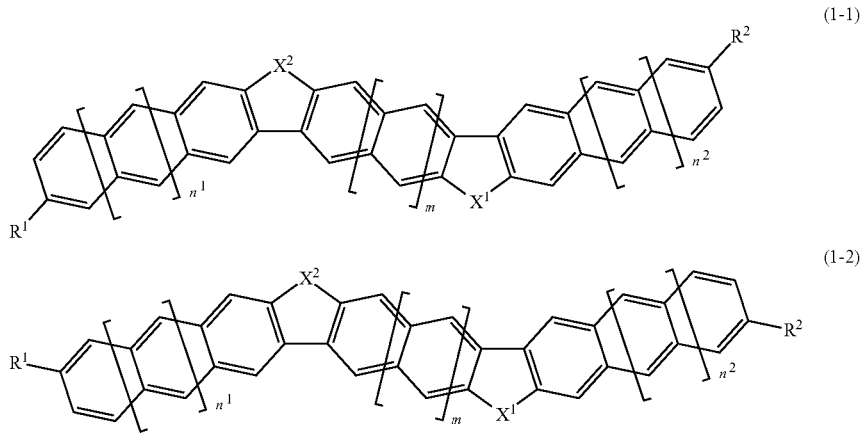

(In Formulas (1-1) and (1-2), $X^1$ and $X^2$ are each independently an oxygen atom, a sulfur atom, or a selenium atom, m is 0 or 1, and $n^1$ and $n^2$ are each independently 0 or 1. $R^1$ and $R^2$ are each independently a fluorine atom, a $C_{1-20}$ alkyl group, a $C_{6-10}$ aryl group, a pyridyl group, a furyl group, a thienyl group, or a thiazolyl group, wherein one or two or more hydrogen atoms contained in the alkyl group may be substituted with a fluorine atom, and one or two or more of the hydrogen atoms contained in the aryl group, pyridyl group, furyl group, thienyl group, and thiazolyl group may be substituted with a fluorine atom or an alkyl group having from 1 to 10 carbons).

$X^1$ and $X^2$ are each independently an oxygen atom, a sulfur atom, or a selenium atom; of these, an oxygen atom or a sulfur atom is preferable in terms of exhibiting high carrier mobility, and a sulfur atom is particularly preferable.

m is 0 or 1, preferably 0.

$n^1$ and $n^2$ are each independently 0 or 1, and 0 is preferable from the perspective of achieving excellent solubility.

Examples of the $C_{1-20}$ alkyl group in $R^1$ and $R^2$ may include the same examples of the $C_{1-20}$ alkyl group in R. Among these examples, in an embodiment of the present invention, a $C_{4-15}$ alkyl groups is preferable, a $C_{6-12}$ alkyl group is more preferable, and a $C_{6-10}$ alkyl group is even more preferable.

Examples of the $C_{6-10}$ aryl group in $R^1$ and $R^2$ may include those having from 6 to 10 carbons among the examples of the $C_{6-20}$ aryl group in R described above. Among them, a phenyl group is preferred.

Examples of the pyridyl group include a 2-pyridyl, a 3-pyridyl, and a 4-pyridyl group.

Examples of the furyl group include a 2-furyl and a 3-furyl group.

Examples of the thienyl group include a 2-thienyl and a 3-thienyl group.

Examples of the thiazolyl group include a 2-thiazolyl group.

One, or two or more of the hydrogen atoms contained in the alkyl group may be substituted with a fluorine atom. Examples of the group in which at least one of the hydrogen atoms contained in the alkyl group is substituted with a fluorine atom include a trifluoromethyl group.

One, or two or more of the hydrogen atoms contained in the aryl group, pyridyl group, furyl group, thienyl group, and thiazolyl group may be substituted with a fluorine atom or an alkyl group having from 1 to 10 carbons, and examples of the alkyl group having from 1 to 10 carbons include straight-chain or branched-chain alkyl groups such as a methyl group, an ethyl group, a propyl group, an isopropyl group, an n-butyl group, a t-butyl group, an n-pentyl group, an n-hexyl group, an n-heptyl group, and an n-decyl group. Among these, an alkyl group having a from 1 to 6 carbons is preferable, and an alkyl group having from 1 to 3 carbons is particularly preferable.

Examples of the group in which at least one of the hydrogen atoms contained in the aryl group is substituted with an alkyl group having from 1 to 10 carbons include a tolyl group and a xylyl group. Furthermore, examples of group in which at least one of the hydrogen atoms contained in the aryl group is substituted with a fluorine atom include a p-fluorophenyl group and a pentafluorophenyl group.

Among these, from the perspective of having high carrier mobility, $R^1$ and $R^2$ are preferably either both or each independently a $C_{1-20}$ alkyl group, a $C_{6-10}$ aryl group, a pyridyl group, a furyl group, a thienyl group, or a thiazolyl group.

Among the compounds represented by Formula (1-1) and Formula (1-2) above, the compounds represented by Formula (1-2) above can maintain a crystalline state even at high temperatures exceeding 200° C., making them preferable from the perspective of achieving excellent thermal stability.

The p-type organic semiconductor material according to an embodiment of the present invention is preferably a compound represented by Formula (2) below:

[Chem. 5]

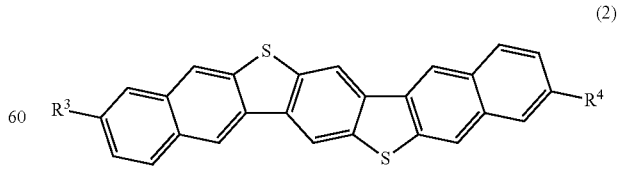

In Formula (2), $R^3$ and $R^4$ are each independently a $C_{1-20}$ alkyl group, a $C_{6-10}$ aryl group, a pyridyl group, a furyl group, a thienyl group, or a thiazolyl group and examples of these include the same as those of the $C_{1-20}$ alkyl group, the $C_{6-10}$ aryl group, the pyridyl group, the furyl group, the thienyl group, and the thiazolyl group in $R^3$ and $R^4$ described above. Among these, $R^3$ and $R^4$ are preferably the same group from the perspective of having high carrier mobility, and are preferably a $C_{1-20}$ alkyl group, a phenyl group, a furyl group, or a thienyl group, more preferably a $C_{1-20}$ alkyl group (of which a $C_{4-15}$ alkyl group is preferable, a $C_{6-12}$ alkyl group is more preferable, and a $C_{6-10}$ alkyl group is most preferable).

From the perspective of having high carrier mobility, the p-type organic semiconductor material according to an embodiment of the present invention is particularly preferably at least one compound selected from the group consisting of the compounds represented by Formulas (2-1) to (2-5) below:

[Chem. 6]

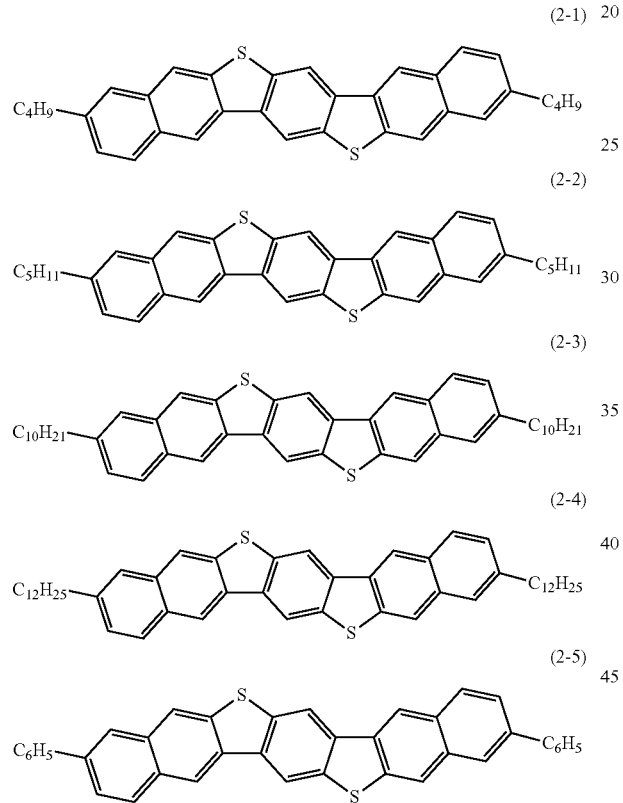

The compounds represented by Formula (1-1) and Formula (1-2) above can be produced by a production method described in, for example, WO 2014/136827. Furthermore, a commercially available product such as products under the trade names "$C_{10}$-DNBDT-NW" and "$C_6$-DNBDT-NW" (both available from Pi-Crystal Inc.) may also be used.

The compounds represented by Formula (1-1) and Formula (1-2) above have the following molecular structure: an N-shape rigid main chain, in which benzene rings range on both sides of a bending point that is a cross-link formed by a chalcogen atom, and in which substituents have been introduced into the benzene rings at both ends. Compared to linear molecules with similar number of rings, compounds with such molecular structure have a higher solubility in Naphthalene Compound (A) and are less likely to precipitate even at low temperatures.

From the perspective of field effect mobility and the like, the n-type organic semiconductor material as the solute contained in the ink composition according to an embodiment of the present invention is preferably a compound having a rigid main chain, such as compounds represented by Formula (3) below:

[Chem. 7]

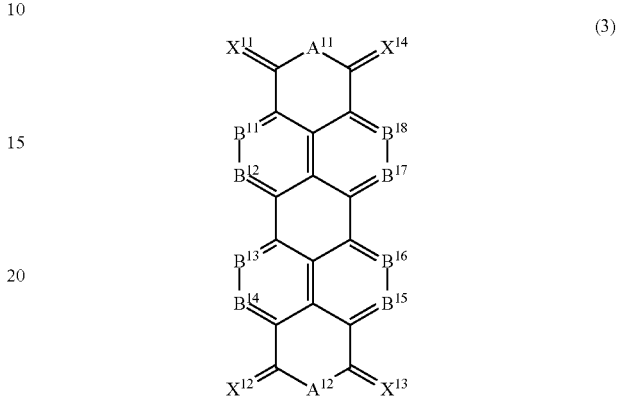

where in Formula (3), $A^{11}$ and $A^{12}$ each independently represent —O—, —N($R^N$)—, or —P($R^N$)—. $B^{11}$ to $B^{18}$ each independently represent —N= or —C($R^M$)=. $R^N$ and $R^M$ represent a hydrogen atom or a substituent. $X^{11}$ to $X^{14}$ each independently represent an oxygen atom or a sulfur atom.

In Formula (3), $A^{11}$ and $A^{12}$ each represent —O—, —N($R^N$)—, or —P($R^N$)—. $A^{11}$ and $A^{12}$ are each preferably —N($R^N$)—. An and $A^{12}$ may be the same as or different from each other, but are preferably the same, and are more preferably both —N($R^N$)—.

$R^N$ represents a hydrogen atom or a substituent. The substituent that can be taken as $R^N$ is not limited. For example, the substituent can be one selected from the following Substituent Group Z.

Substituent Group Z: A halogen atom (such as a fluorine atom, a chlorine atom, a bromine atom, and an iodine atom, of which a fluorine atom or a chlorine atom are preferable) an alkyl group (preferably having from 1[3] to 40 carbons, more preferably having from 1[3] to 20 carbons, and particularly preferably having from 4 to 20 carbons. Numbers in square brackets represent the number of carbons when the alkyl group is a cycloalkyl group. Examples of the alkyl group include methyl, ethyl, propyl, 2-methylpropyl, butyl, amyl, pentyl, 2,2-dimethylpropyl, hexyl, 1-methylpentyl [(1S)-1-methylpentyl, (1R)-1-methylpentyl], heptyl, octyl, nonyl, decyl, undecyl, dodecyl, tridecyl, tetradecyl, pentadecyl, 2,6-dimethyloctyl, icosyl, 2-decyltetradecyl, 2-hexyldodecyl, 2-ethyloctyl, 2-decyltetradecyl, 2-butyldecyl, 1-octylnonyl, 2-ethyloctyl, 2-octyldecyl, 2-octyldodecyl, 7-hexylpentadecyl, 2-octyltetradecyl, 2-ethylhexyl, cyclopropyl, cyclobutyl, cyclopentyl, cyclohexyl, adamantyl, benzyl, p-chlorobenzyl, 2-phenylethyl, 3-phenylpropyl, trifluoromethyl, perfluoroethyl, 2,2,3,3,4,4,4-heptafluorobutyl, $C_5F_{11}C_2H_4$—, 3-aminopropyl, 4-aminobutyl, 5-ethoxypentyl, (meth)acryloxypropyl, (meth)acryloxypentyl, 4-hydroxybutyl, 4-sulfobutyl, 10-phosphonodecyl, 2-hydroxyethoxymethyl, 2-imidazolylethoxymethyl, 4-(N,N-dimethylamino)butyl), an alkenyl group (preferably having from 2 to 20 carbons, more preferably having from 2 to 12 carbons, particularly preferably having from 2 to 8 carbons, such as vinyl, allyl, 2-butenyl, 1-pentenyl, and 4-pentenyl), an alkynyl group (preferably having from 2 to 20 carbons, more preferably having from 2 to 12 carbons, particularly preferably having from 2 to 8 carbons, such as propargyl, 1-pentynyl, trimethylsilylethynyl, triethylsilylethynyl, tri-i-propylsilylethynyl, and 2-p-propylphenylethynyl), an aryl group (preferably having from 6 to 20 carbon carbons, more preferably having from 6 to 12 carbon carbons, such as phenyl, naphthyl, 2,4,6-trimethylphenyl, p-(t-butyl)phenyl, 4-methyl-2,6-dipropylphenyl, 4-fluorophenyl, 4-trifluoromethylphenyl, p-pentylphenyl, 3,4-dipentylphenyl, p-heptoxyphenyl, and 3,4-diheptoxyphenyl), a heterocyclic group (the ring-constituting atoms contain at least one heteroatom and from 1 to 30 carbon atoms. Examples of the heteroatom include a nitrogen atom, an oxygen atom, and a sulfur atom, and the number the heteroatom is not limited, but is, for example, from 1 to 2. The number of the ring-constituting carbon atoms is preferably from 3 to 20 and more preferably from 3 to 12. The heterocyclic group is preferably a 5- or 6-membered ring or a fused ring thereof. The heterocyclic groups include aromatic heterocyclic groups [heteroaryl groups] and aliphatic heterocyclic groups. For example, thienyl, thiazolyl, imidazolyl, pyridyl, pyrimidinyl, quinolyl, furanyl, selenophenyl [$C_4H_3Se$], piperidyl, morpholino, benzoxazolyl, benzimidazolyl, benzthiazolyl, 2-hexylfuranyl, and pyranyl), a silyl group (preferably having from 3 to 40 carbons, more preferably having from 3 to 30 carbons, particularly preferably having from 3 to 24 carbons, such as trimethylsilyl, triphenylsilyl, and dimethylphenylsilyl), an alkoxy group (preferably having from 1 to 20 carbons, more preferably having from 1 to 12 carbons, particularly preferably having from 1 to 8 carbons, such as methoxy, ethoxy, and butoxy), an amino group (preferably having from 0 to 20 carbons, more preferably having from 0 to 10 carbons, particularly preferably having from 0 to 6 carbons, such as amino, methylamino, dimethylamino, diethylamino, dibenzylamino, and anilino), an aryloxy group (preferably having from 6 to 20 carbons, more preferably having from 6 to 16 carbons, particularly preferably having from 6 to 12 carbons, such as phenyloxy and 2-naphthyloxy), an acyl group (preferably having from 1 to 20 carbons, more preferably having from 1 to 16 carbons, particularly preferably having from 1 to 12 carbons, such as acetyl, hexanoyl, benzoyl, formyl, and pivaloyl), an alkoxycarbonyl group (preferably having from 2 to 20 carbons, more preferably having from 2 to 16 carbons, particularly preferably having from 2 to 12 carbons, such as methoxycarbonyl and ethoxycarbonyl), an aryloxycarbonyl group (preferably having from 7 to 20 carbons, more preferably having from 7 to 16 carbons, particularly preferably having from 7 to 10 carbons, such as phenyloxycarbonyl), an acyloxy groups (preferably having from 2 to 20 carbons, more preferably having from 2 to 16 carbons, particularly preferably having from 2 to 10 carbons, such as acetoxy, benzoyloxy or (meth)acryloyloxy), an acylamino group (preferably having from 2 to 20 carbons, more preferably having from 2 to 16 carbons, particularly preferably having from 2 to 10 carbons, such as acetylamino and benzoylamino), an aminocarbonylamino group (preferably having from 2 to 20 carbons, more preferably having from 2 to 16 carbons, particularly preferably having from 2 to 12 carbons, such as a ureido group), an alkoxy or aryloxycarbonylamino group (preferably having from 2[7] to 20 carbons, more preferably having from 2[7] to 16 carbons, particularly preferably having from 2[7] to 12 carbons. Numbers in square brackets represent the number of carbons in the case of an aryloxycarbonylamino group. Examples include methoxycarbonylamino or phenyloxycarbonylamino), an alkyl or arylsulfonylamino group, an alkylthio group (preferably having from 1 to 20 carbons, more preferably having from 1 to 16 carbons, particularly preferably having from 1 to 12 carbons, such as methylthio, ethylthio, and octylthio), an arylthio group (preferably having from 6 to 20 carbons, more preferably having from 6 to 16 carbons, particularly preferably having from 6 to 12 carbons, such as a phenylthio group), an alkyl or arylsulfinyl group, an alkyl or arylsulfonyl group, a silyloxy group, a heterocyclic oxy group, a carbamoyl group, a carbamoyloxy group, a heterocyclic thio group, a sulfamoyl group, an aryl or heterocyclic azo group, an imide group, a phosphino group, a phosphinyl group, a phosphinyloxy group, a phosphinylamino group, a hydrazino group, an imino group, a cyano group, a hydroxy group, a nitro group, a mercapto group, a sulfo group, a carboxy group, a hydroxamic acid group, a sulfino group, a boronic acid group ($—B(OH)_2$), a phosphato group ($—OPO(OH)_2$), a phosphono group ($—PO(OH)_2$), and a sulfato group ($—OSO_3H$).

A group selected from the abovementioned Substituent Group Z that can be taken as $R^N$ is preferably an alkyl group, an aryl group, an alkenyl group, an alkynyl group, a heterocyclic group, or a silyl group, more preferably an alkyl group (preferably having from 1 to 20 carbons), an aryl group (preferably having from 6 to 20 carbons), or a heteroaryl group (containing at least one or more of the above heteroatoms as a ring-constituting atom. Preferably a 5- or 6-membered ring or a fused ring thereof. The number of ring-constituting carbon atoms is preferably from 3 to 20), and even more preferably an alkyl group (particularly preferably having from 4 to 20 carbons).

The group selected from Substituent Group Z above may further include a substituent. Examples of such a substituent include a group selected from Substituent Group Z.

The number of substituents that may be further contained in the group further containing a substituent (also referred to as a combined group) is not limited, but is preferably, for example, from 1 to 6, more preferably from 1 to 3.

The combined group is not limited, and examples thereof include a group in which each of the aforementioned groups preferred as a group selected from Substituent Group Z described above is substituted with another group selected from Substituent Group Z. Specific examples include a halogen atom, an alkyl group, an aryl group, a heterocyclic group (heteroaryl group), an alkoxy group (including a hydroxyalkoxy group, an alkyl halide group, and a heteroarylalkoxy group), an amino group, an acyloxy group, a hydroxy group, an alkyl group having a group selected from the group consisting of a sulfato group and a phosphono group as a substituent, an aryl halide group or (fluorinated) alkylaryl group, and an alkynyl group having a silyl group as a substituent. Furthermore, the examples also include a group in which one hydrogen atom is removed from the compound represented by Formula (3).

More specifically, the examples include the groups in the examples of Substituent Group Z described above, and groups in the following exemplified compounds or compounds used in Examples.

Among these, the combined group is preferably an alkyl group having a halogen atom as a substituent (alkyl halide group) or an alkyl group having an aryl group as a substituent, more preferably an alkyl group having a fluorine atom as a substituent (alkyl fluoride group) or an alkyl group having an aryl group as a substituent, particularly preferably an alkyl group having an aryl group as a substituent.

The substituent that can be taken as $R^N$ is more preferably an (unsubstituted) alkyl group, an alkyl halide group, or an alkyl group having an aryl group as a substituent.

When $A^{11}$ and $A^{12}$ each have an $R^N$, the two $R^N$s may be the same as or different from each other.

In Formula (3), $B^{11}$ to $B^{18}$ each represents —N═ or —C($R^M$)═. Here, $R^M$ represents a hydrogen atom or a substituent.

The substituent that can be taken as $R^M$ is not limited, and examples include groups selected from Substituent Group Z above. The group selected from Substituent Group Z above may further contain a substituent. Examples of such a substituent include a group selected from Substituent Group Z. Examples of groups further containing a substituent include the combined group described above which may be taken as $R^N$, and specific examples include the groups listed above, and further include groups having a methine group bonded to a carbon atom of the compounds represented by Formula (3).

$R^M$ is preferably a hydrogen atom, an alkyl group, an alkenyl group, an alkoxycarbonyl group, an aryl group, an alkoxy group, a heterocyclic group (particularly a heteroaryl group), an amino group, a halogen atom, a cyano group, a carboxy group, a nitro group, or a mercapto group, more preferably a hydrogen atom, an alkyl group, an alkenyl group, an aryl group, an alkoxy group, a heterocyclic group (particularly a heteroaryl group), a halogen atom, or a cyano group, and particularly preferably a hydrogen atom, an alkyl group, an aryl group, a heterocyclic group (particularly a heteroaryl group), a halogen atom, or a cyano group.

Substituents that can be taken as $R^M$ may form a ring. Aspects in which the substituents form a ring include an aspect in which the substituents bond to each other to form a ring, and an aspect in which a plurality of substituents share one atom to form a ring.

Examples of the aspect in which the substituents bond to each other to form a ring include an aspect in which two vinyl groups bond to each other to form a benzene ring together with the carbon atom to which the $R^M$ bonds. Furthermore, examples of the aspect in which a plurality of substituents share one atom to form a ring include an aspect in which two substituents come together to form a sulfur atom (—S— group).

Among $B^{11}$ to $B^{18}$, preferably at least one is —N═, more preferably from 1 to 4 are —N═, even more preferably 1 or 2 are —N═, and particularly preferably two are —N═. Furthermore, an aspect in which all of $B^{11}$ to $B^{18}$ are —C($R^M$)═ is also preferable.

The B which can be —N═ is not limited, and any one of $B^{11}$ to $B^{18}$ may be —N═. For example, preferably, at least one of the group consisting of $B^{12}$, $B^{13}$, $B^{16}$, and $B^{17}$ is —N═, and more preferably, one or both of $B^{12}$ and $B^{16}$ is —N═.

—N═, which may be taken as $B^{11}$ to $B^{18}$, may have a substituent on its nitrogen atom. Examples include an N-oxide group (N→O group) and a salt having a counter anion.

In Formula (3), $X^{11}$ to $X^{14}$ each represents an oxygen atom or a sulfur atom, preferably an oxygen atom. It is more preferable that all of $X^{11}$ to $X^{14}$ are oxygen atoms.

Here, the combination of $A^{11}$ and $A^{12}$ and $X^{11}$ to $X^{14}$ is not limited, but a combination in which $A^{11}$ and $A^{12}$ are —N($R^N$)— while $X^{11}$ to $X^{14}$ are oxygen atoms is preferable.

From the perspective of having high carrier mobility, the compound represented by Formula (3) is particularly preferably at least one compound selected from the group consisting of compounds represented by Formula (3-1) to (3-5) below.

A compound represented by Formula (3-1): N,N'-bis(2-phenylethyl)pyrene-3,4,9,10-dicarbodiimide A compound represented by Formula (3-2): N,N'-bis(3-phenylpropyl)pyrene-3,4,9,10-dicarbodiimide A compound represented by Formula (3-3): N,N'-bis(octyl)pyrene-3,4,9,10-dicarbodiimide (C8PDI)

A compound represented by Formula (3-4): 2,9-bis(2,2,3,3,4,4,4-heptafluorobutyl)-1,2,3,8,9,10-hexahydro-1,3,8,10-tetraoxoanthra[2,1,9-def:6,5,10-d'e'f']diisoquinoline-5,12-dicarbonitrile (PDI-FCN2 (1,7))

A compound represented by Formula (3-5): 2,9-bis[(1S)-1-methylpentyl]-1,2,3,8,9,10-hexahydro-1,3,8,10-tetraoxoanthra[2,1,9-def:6,5,10-d'e'f']diisoquinoline-5,12-dicarbonitrile (PDI1MPCN2 (1,7))

[Chem. 8]

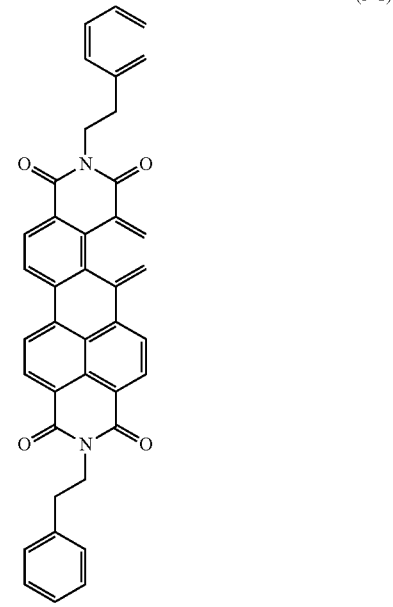

(3-1)

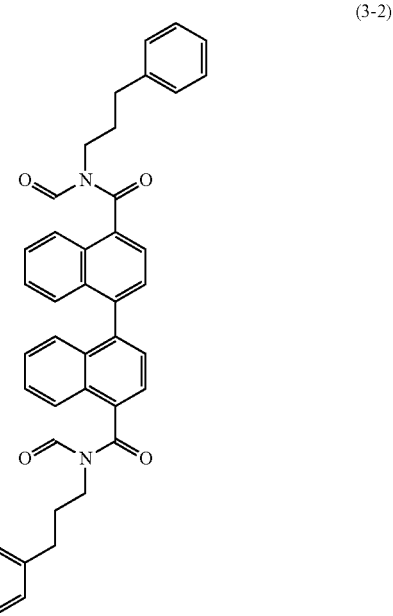

(3-2)

-continued (3-3)
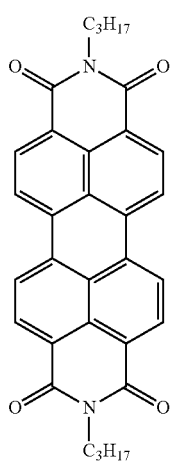

(3-4)
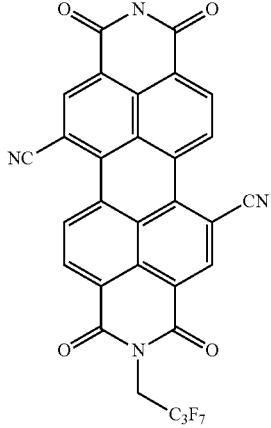

(3-5)
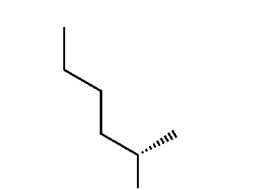

The compound represented by Formula (3) above can be produced by a production method described in, for example, WO 2011/082234 or JP 2018-6745 A; or, a commercially available product can also be used.

The compound represented by Formula (3) above has a structure in which substituents are introduced into the imide nitrogen at both ends of the perylene diimide skeleton as the rigid main chain, and therefore, the compound has a high solubility in Naphthalene Compound (A) and is less likely to precipitate even at low temperatures.

As another example of an n-type organic semiconductor material as a solute contained in the ink composition according to an embodiment of the present invention, a compound having a naphthalene diimide skeleton as a rigid main chain is also preferable, and examples thereof include compounds represented by Formula (4) below and compounds represented by Formula (5) below:

[Chem. 9]

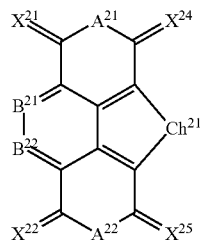
(4)

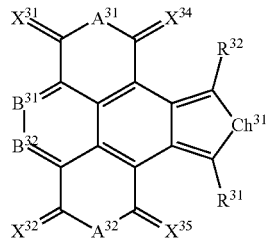
(5)

[In Formula (4) above, $A^{21}$ and $A^{22}$ each independently represent —N($R^{N1}$)—, —P($R^{N1}$)—, or —O—. $R^{N1}$ represents a hydrogen atom or a substituent. Each of the plurality of $R^{N1}$ may be the same or different.

In Formula (4) above, $B^{21}$ and $B^{22}$ each independently represent —N= or —C($R^{M1}$)=. $R^{M1}$ represents a hydrogen atom or a substituent. When both $B^{21}$ and $B^{22}$ are —C($R^{M1}$)=, the $R^{M1}$ contained in $B^{21}$ and the $R^{M1}$ contained in $B^{22}$ may form a ring.

In Formula (4) above, $Ch^{21}$ represents a sulfur atom, a sulfinyl group, a sulfonyl group, a selenium atom, a seleninyl group, a selenonyl group, or a group represented by —$B^{23}$—$B^{24}$—. $B^{23}$ and $B^{24}$ each independently represent —N= or —C($R^{M2}$)=. $R^{M2}$ represents a hydrogen atom or a substituent. When both $B^{23}$ and $B^{24}$ are —C($R^{M2}$)=, the $R^{M2}$ contained in $B^{23}$ and the $R^{M2}$ contained in $B^{24}$ may form a ring.

In Formula (4) above, $X^{21}$, $X^{22}$, $X^{23}$, and $X^{24}$ each independently represent an oxygen atom or a sulfur atom.

In Formula (5) above, $A^{31}$ and $A^{32}$ each independently represent —N($R^{N1}$)—, —P($R^{N1}$) or —O—. $R^{N1}$ represents a hydrogen atom or a substituent. Each of the plurality of $R^{N1}$ may be the same or different.

In Formula (5) above, $B^{31}$ and $B^{32}$ each independently represent —N= or —C($R^{M1}$)=. $R^{M1}$ represents a hydrogen atom or a substituent. When both $B^{31}$ and $B^{32}$ are $-C(R^{M1})=$, the $R^{M1}$ contained in $B^{31}$ and the $R^{M1}$ contained in $B^{32}$ may form a ring.

In Formula (5) above, $Ch^{31}$ represents a sulfur atom, a sulfinyl group, a sulfonyl group, a selenium atom, a seleninyl group, or a selenonyl group.

In Formula (5) above, $X^{31}$, $X^{32}$, $X^{33}$, and $X^{34}$ each independently represent an oxygen atom or a sulfur atom.

In Formula (5) above, $R^{31}$ and $R^{32}$ each independently represent a hydrogen atom or a substituent].

In Formula (4) above, $A^{21}$ and $A^{22}$ each independently represent $-N(R^{N1})-$, $-P(R^{N1'})-$, or $-O-$. Among these, from the perspective of further improving carrier mobility, $A^{21}$ and $A^{22}$ are each independently preferably $-N(R^{N1})-$ or $-P(R^{N1})-$, and more preferably $-N(R^{N1})-$.

$R^{N1}$ represents a hydrogen atom or a substituent. Each of the plurality of $R^{N1}$ may be the same or different. The substituent represented by $R^{N1}$ is not limited, and examples include a group selected from Substituent Group Z described above.

$A^{21}$ and $A^{22}$ are preferably the same group from the perspective of further improving carrier mobility.

Among these, $R^{N1}$ is preferably a hydrogen atom, a silyl group, a heterocyclic group, an aryl group, an alkynyl group, or a linear, branched, or cyclic alkyl group. Note that each of the groups mentioned above, not including the hydrogen atom, may be further substituted by a substituent selected from Substituent Group Z described above.

Among these, from the perspective of further improving carrier mobility, $R^{N1}$ is preferably a linear, branched or cyclic alkyl group having from 1 to 20 carbons, an aryl group having from 6 to 20 carbons, or a heteroaryl group having from 3 to 20 carbons, more preferably a linear, branched or cyclic alkyl group having from 1 to 20 carbons. Note that each of the groups mentioned above may be further substituted by a substituent selected from Substituent Group Z described above.

Furthermore, from the perspective of even further improving carrier mobility, $R^{N1}$ is even more preferably a cyclic alkyl group (cycloalkyl group) having from 3 to 8 carbons (preferably from 4 to 7 carbons, more preferably from 5 to 6 carbons), and is particularly preferably a cyclohexyl group.

In Formula (4), $B^{21}$ and $B^{22}$ each independently represent $-N=$ or $-C(R^{M1})=$. From the perspective of improving air stability, $B^{21}$ and $B^{22}$ are preferably both $-C(R^{M1})=$, or one is $-N=$ while the other $-C(R^{M1})=$, and are more preferably both $-C(R^{M1})=$.

When $B^{21}$ and $B^{22}$ are both $-C(R^{M1})=$, the $R^{M1}$ contained in $B^{21}$ and the $R^{M1}$ contained in $B^{22}$ may form a ring. When forming a ring, an aromatic heterocyclic ring or an aromatic hydrocarbon ring is preferable, and a benzene ring is more preferable. Note that when $R^{M1}$ contained in $B^{21}$ and $R^{M1}$ contained in $B^{22}$ form a ring, the ring may have a substituent selected from Substituent Group Z described above, or the substituents may bond together to further form a ring.

$R^{M1}$ represents a hydrogen atom or a substituent. Note that in Formula (4), when there is a plurality of $R^{M1}$, the plurality of $R^{M1}$ may be the same or different. The substituent represented by $R^{M1}$ is not limited, and examples include a group selected from Substituent Group Z described above.

Among these, $R^{M1}$ is preferably a hydrogen atom, a halogen atom, an alkyl halide group, a cyano group, a nitro group, an alkoxy group, an alkoxycarbonyl group, a carboxy group, a heterocyclic group, or an amino group, more preferably a hydrogen atom, a halogen atom, or a cyano group, and even more preferably a hydrogen atom or a cyano group.

In particular, in Formula (4), when at least one of $B^{21}$ and $B^{22}$ is $-C(R^{M1})=$, at least one $R^{M1}$ is preferably a halogen atom or a cyano group, more preferably a cyano group. This is for furthering improving air stability.

In Formula (4), $Ch^{21}$ represents a sulfur atom, a sulfinyl group ($-SO-$), a sulfonyl group ($-SO^2-$), a selenium atom, a seleninyl group ($-SeO-$), a selenonyl group ($-SeO_2-$), or a group represented by $-B^{23}-B^{24}-$. $B^{23}$ and $B^{24}$ each independently represent $-N=$ or $-C(R^{M2})=$. $R^{M2}$ represents a hydrogen atom or a substituent. When $B^{23}$ and $B^{24}$ are both $-C(R^{M2})=$, the $R^{M2}$ contained in $B^{23}$ and the $R^{M2}$ contained in $B^{24}$ may form a ring.

From the perspective of improving air stability, $B^{23}$ and $B^{24}$ are preferably both $-C(R^{M2})=$, or one is $-N=$ while the other $-C(R^{M2})=$, and are more preferably both $-C(R^{M2})=$.

When $B^{23}$ and $B^{24}$ are both $-C(R^{M2})=$, the $R^{M2}$ contained in $B^{23}$ and the $R^{M2}$ contained in $B^{24}$ may form a ring. When forming a ring, an aromatic heterocyclic ring or an aromatic hydrocarbon ring is preferable, and a benzene ring is more preferable. Note that when $R^{M2}$ contained in $B^{23}$ and $R^{M2}$ contained in $B^{24}$ form a ring, the ring may have a substituent selected from Substituent Group Z described above, or the substituents may bond together to further form a ring.

$R^{M2}$ represents a hydrogen atom or a substituent. Note that in Formula (4), when there is a plurality of $R^{M2}$, the plurality of $R^{M2}$ may be the same or different. The substituent group that can be taken as $R^{M2}$ is not limited, and examples include groups selected from Substituent Group Z described above.

$Ch^{21}$ is preferably a sulfur atom, a selenium atom, or a group represented by $-B^{23}-B^{24}-$, from the perspective of further improving carrier mobility.

In Formula (4), $X^{21}$, $X^{22}$, $X^{23}$, and $X^{24}$ each independently represent an oxygen atom or a sulfur atom, but from the perspective of further improving air stability, it is preferable that $X^{21}$, $X^{22}$, $X^{23}$, and $X^{24}$ are all oxygen atoms.

In Formula (5), $A^{31}$ and $A^{32}$ are synonymous with $A^{11}$ and $A^{22}$ in Formula (4) above, respectively, and each independently represent $-N(R^{N1})-$, $-P(R^{N1})-$ or $-O-$. $R^{N1}$ represents a hydrogen atom or a substituent. Each of the plurality of $R^{N1}$ may be the same or different. The substituent represented by $R^{N1}$ is not limited, and examples include a group selected from Substituent Group Z described above.

Furthermore, the preferred aspects of $A^{31}$ and $A^{32}$ in Formula (5) are also the same as the preferred aspects of $A^{21}$ and $A^{22}$ in Formula (4) above.

In Formula (5), $B^{31}$ and $B^{32}$ are synonymous with $B^{21}$ and $B^{22}$ in Formula (4) above, respectively, and each independently represent $-N=$ or $-C(R^{M1})=$. $R^{M1}$ represents a hydrogen atom or a substituent. Note that in Formula (5), when there is a plurality of $R^{M1}$, the plurality of $R^{M1}$ may be the same or different. The substituent represented by $R^{M1}$ is not limited, and examples include a group selected from Substituent Group Z described above.

Furthermore, the preferred aspects of $B^{31}$ and $B^{32}$ in Formula (5) are also the same as the preferred aspects of $B^{21}$ and $B^{22}$ in Formula (4) above.

When $B^{31}$ and $B^{32}$ are both $-C(R^{M1})=$, the $R^{M1}$ contained in $B^{31}$ and the $R^{M1}$ contained in $B^{32}$ may form a ring. The aspects in this case are also the same as Formula (4) above.

In Formula (5), $X^{31}$, $X^{32}$, $X^{33}$, and $X^{34}$ are synonymous with $X^{21}$, $X^{22}$, $X^{23}$, and $X^{24}$ in Formula (4) above, respectively, and each independently represent an oxygen atom or a sulfur atom.

Furthermore, the preferred aspects of $X^{31}$, $X^{32}$, $X^{33}$, and $X^{34}$ in Formula (5) are also the same as the preferred aspects of $X^{21}$, $X^{22}$, $X^{23}$, and $X^{24}$ in Formula (4) above.

In Formula (5), $Ch^{31}$ represents a sulfur atom, a sulfinyl group (—SO—), a sulfonyl group (—$SO^2$—), a selenium atom, a seleninyl group (—SeO—), or a selenonyl group (—$SeO_2$—), but is preferably a sulfur atom or a selenium atom from the perspective of further improving carrier mobility.

In Formula (5), $R^{31}$ and $R^{32}$ each independently represent a hydrogen atom or a substituent. The substituents represented by $R^{31}$ and $R^{32}$ are not limited, and examples include a group selected from Substituent Group Z described above.

Among these, from the perspective of further improving carrier mobility, $R^{31}$ and $R^{32}$ are preferably each independently a hydrogen atom, a cyano group, a halogen atom, a silyl group, or a linear, branched or cyclic alkyl group having from 1 to 20 carbons, and more preferably a hydrogen atom, a methyl group, a halogen atom, or a cyano group.

The compound represented by Formula (4) and the compound represented by Formula (5) above can be produced by a production method described in, for example, WO 2011/082234 or WO 2017/022735; or, a commercially available product can also be used.

The compound represented by Formula (4) and Formula (5) above has a structure in which substituents are introduced into the imide nitrogen at both ends of the naphthalene diimide skeleton as the rigid main chain, and therefore, the compound has a high solubility in Naphthalene Compound (A) and is less likely to precipitate even at low temperatures.

Macromolecular Compound

The ink composition according to an embodiment of the present invention may contain a macromolecular compound in addition to Naphthalene Compound (A) and the solute descried above. The macromolecular compound is preferably selected from inert polymers that do not affect the electrical properties of the organic semiconductor material, and examples include epoxy resins, acrylic resins, polystyrene resins, cellulose resins, and butyral resins; specifically, PMMA (polymethyl methacrylate), PS (polystyrene), PVA (polyvinyl alcohol), PVB (polyvinyl butyral), poly(2,3,4,5,6-pentafluorostyrene), PVP (polyvinyl phenol), BCB (benzocyclobutene), POSS (cage-like oligosilsesquioxane), PTFEMA (poly(2,2,2-trifluoroethyl methacrylate)), and P2VP (poly(2-vinylpyridine)) can be selected as appropriate. In the edge-casting method or the continuous edge-casting method described below, in cases where an organic semiconductor material with low solubility is used, the inclusion of the above macromolecular compound has the effect of improving film-forming properties, such as improving the in-plane uniformity of the organic single crystal. In addition, by containing the above macromolecular compound, the effect on the insulating film interface can be minimized, and high performance may be brought out on any insulating film surface. The film-forming properties referred to in the present specification means that during the forming of an organic single-crystal film, the film-forming properties are good enough to form a film at a low temperature and a high speed at the set values of, for example, ink composition temperature, substrate temperature, coating speed (single crystal growth speed), slit temperature, piping temperature, ink tank temperature, and distance between slit and substrate.

When the ink composition according to an embodiment of the present invention contains the macromolecular compound described above, the content of the macromolecular compound is not limited, but is preferably from 0.01 to 20 wt. %, more preferably from 0.1 to 10 wt. %, per 100 wt. % of the ink composition. When the content of the macromolecular compound is within this range, the film-forming properties of the ink composition according to an embodiment of the present invention tends to be improved.

The ink composition according to an embodiment of the present invention contains Naphthalene Compound (A) as a solvent, a solute (in particular, an organic semiconductor material), and, as necessary, the aforementioned macromolecular compound. Naphthalene Compound (A), the solute, and the macromolecular compound to be combined as necessary can all be used alone or in a combination of two or more.

The ink composition according to an embodiment of the present invention can be prepared, for example, by mixing Naphthalene Compound (A), the solute, and the macromolecular compound to be combined as necessary, and heating the mixture at a temperature of approximately from 70 to 150° C. in an air atmosphere, nitrogen atmosphere, or argon atmosphere for approximately from 0.1 to 5 hours.

The content of Naphthalene Compound (A) (the total amount if two or more types are contained) in the total amount of the ink composition according to an embodiment of the present invention is, for example, not greater than 99.999 wt. %. The lower limit is, for example, 90.000 wt. %, preferably 93.000 wt. %, particularly preferably 95.000 wt. %, while the upper limit is preferably 99.990 wt. %.

The content of the solute (the total amount if two or more types are contained), in particular, the organic semiconductor material, in the ink composition according to an embodiment of the present invention is, for example, 0.02 parts by weight or greater, preferably 0.03 parts by weight or greater, and particularly preferably 0.04 parts by weight or greater, per 100 parts by weight of Naphthalene Compound (A). The upper limit of the content of the solute is, for example, 1 part by weight, preferably 0.5 part by weight, and particularly preferably 0.1 part by weight.

Organic Thin-Film Transistor

Next, a structure of and a method for manufacturing an organic thin-film transistor having an organic single-crystal semiconductor which is used in the ink composition for manufacturing an organic semiconductor device according to an embodiment of the present invention will be described with reference to FIGS. 1 and 2.

Figure 2:
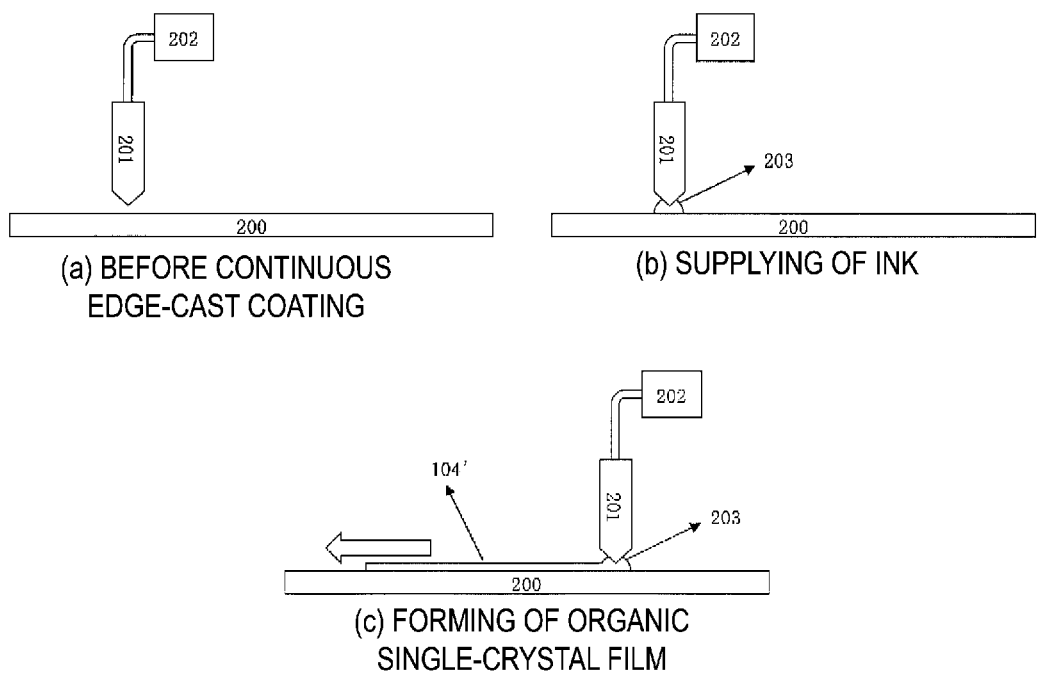
FIG. 2 is a drawing illustrating the concept of an example of a continuous edge-casting method.

FIG. 1 is a schematic diagram of a cross-sectional structure of an example of the organic thin-film transistor. The organic thin-film transistor includes a resin substrate 101 that is flexible, a conductive thin film (gate electrode) 102, a gate insulating film 103, an organic single-crystal semiconductor thin film 104, a conductive thin film (source electrode, drain electrode) 105, a charge injection layer for ohmic contact formation 106, and a protective layer 107 which are formed on a temporary fixing substrate for handling 100 (also referred to as a carrier substrate) during processing. The production of the organic thin-film transistor will be described briefly below.

First, the conductive thin film 102 is formed on the resin substrate 101 which is temporarily fixed on the temporary fixing substrate for handling 100, and is used as a gate electrode for the organic thin-film transistor. Examples of the method of forming the conductive thin film 102 include a PVD method exemplified by a sputtering and a vacuum deposition method, or a method in which the conductive thin film 102 is formed on the resin substrate 101 by a coating method using an ink containing a conductive material and then patterned into a predetermined shape by photolithography.

Other methods of forming the conductive thin film 102 include, for example, a method of directly forming the conductive thin film 102 that has been patterned into a predetermined shape on the resin substrate 101 using a plate-based printing method or a non-plate printing method. By directly forming the conductive thin film 102 that has been patterned into a predetermined shape, the process can be simplified.

In addition, the conductive thin film 102 may be formed by a plating method. Examples of the method of forming the conductive thin film 102 by a plating method include the following one: first, a plating primer layer patterned into a predetermined shape in advance is formed on the resin substrate 101 by photolithography, a plate-based printing method, or a non-plate printing method; then, the conductive thin film 102 is formed at a predetermined position by an electroless plating method, or a combination of an electroless plating method and an electrolytic plating method.

The thickness of the conductive thin film 102 is not limited, but is preferably from 20 nm to 1 µm, and more preferably from 20 nm to 300 nm.

Next, the gate insulating film 103 is formed on the resin substrate 101 and the conductive thin film 102. The gate insulating film 103 is preferably an organic insulating film that is represented by a metal compound having a high relative permittivity and that contains ferroelectrics, such as ceramics, or macromolecular compounds. The thickness of the gate insulating film 103 is not limited, but is preferably from 1 nm to 1 µm, more preferably from 10 nm to 600 nm, and even more preferably from 10 nm to 200 nm.

Next, an organic single-crystal semiconductor film 104' is formed on the gate insulating film 103 using the ink composition according to an embodiment of the present invention by a drop-casting method, an inkjet printing method, an edge-casting method, or a continuous edge-casting method. The edge-casting method or the continuous edge-casting method can be performed in accordance with a known method (for example, the method described in JP 2015-185620 A). FIG. 2 is a conceptual view of an example of a method for forming the organic single-crystal semiconductor film by a continuous edge-casting method. To briefly explain FIG. 2: at least a substrate stage for placing a substrate on a continuous edge-casting apparatus 200, a slit for continuous edge-casting application and ink supply 201, and an ink tank 202 are provided; by pressurizing the ink tank 202, ink is supplied to the substrate surface to form an ink meniscus 203; then, the organic single-crystal semiconductor film 104' is obtained by fine-tuning all parameters such as the application speed (single crystal growth speed), heating of each part of the apparatus, heating of the substrate, and evaporation rate. The drop-casting and inkjet printing methods can also be performed in accordance with known methods.

Then, the organic single-crystal semiconductor film 104', that is formed by a drop-casting method, an inkjet printing method, an edge-casting method, or a continuous edge-casting method, and that has not been patterned into the shape of a transistor, is subsequently patterned into a predetermined shape by photolithography to form the organic single-crystal semiconductor thin film 104. Furthermore, after forming the organic single-crystal semiconductor thin film 104, a firing treatment may be performed to control the morphology or volatilize the solvent contained in the organic single-crystal semiconductor thin film 104. The thickness of the organic single-crystal semiconductor thin film 104 is not limited, but is preferably from 1 nm to 1000 nm, more preferably from 1 nm to 100 nm, and even more preferably from 1 nm to 50 nm. The best film is more preferably a crystal film having from 3 to 6 molecular layers or less, and the optimum total number of molecules varies depending on the molecular structure.

Next, the conductive thin film 105 that is patterned is formed on the gate insulating film 103 and the organic single-crystal semiconductor thin film 104. The conductive thin film 105 forms the source and the drain electrodes of the organic thin-film transistor.

The conductive thin film 105 may be formed by the same methods as those of forming the conductive thin film 102 described above. Note that the methods of forming the conductive thin film 105 and the conductive thin film 102 may be the same or different. Additionally, as necessary, the charge injection layer for ohmic contact formation 106 for bringing the organic single-crystal semiconductor thin film 104 and the conductive thin film 105 in to ohmic contact may be provided between the organic single-crystal semiconductor thin film 104 and the conductive thin film 105.

The thickness of the conductive thin film 105 (that is, the thickness of the source electrode and the drain electrode of the organic thin-film transistor) is not limited, but is preferably from 20 nm to 1 µm, more preferably from 20 nm to 600 nm, and even more preferably from 20 nm to 500 nm.

Next, the protective layer 107 is formed on the gate insulating film 103, the organic single-crystal semiconductor thin film 104, and the conductive thin film 105. Examples of the method of forming the protective layer 107 include a PVD method exemplified by a vacuum deposition method, a CVD method exemplified by an ALD (atomic layer deposition) method, and a method in which the protective layer 107 is formed by a coating method using an ink containing a protective layer material and then patterned into a predetermined shape by photolithography. Other methods of forming the protective layer 107 include, for example, a method of directly forming the protective layer 107 that has been patterned into a predetermined shape by using a plate-based printing method or a non-plate printing method. By directly forming the protective layer 107 that has been patterned into a predetermined shape, the process of forming the protective layer 107 can be simplified.

Of these, a method of directly forming the protective layer 107 that has been patterned into a predetermined shape by using a plate-based printing method or a non-plate printing method is preferable. Alternatively, patterning may be performed by making a hole in a predetermined place by laser ablation.

When directly forming the protective layer 107 that has been patterned into a predetermined shape by using a plate-based printing method or a non-plate printing method, it is possible to use an ink containing various protective layer materials. Examples of the ink containing protective layer materials include a dispersed ink containing an inorganic material, a SOG (spin-on glass) material, an ink containing a low-molecular protective layer material, and an ink containing a macromolecular protective layer material, of which an ink containing a macromolecular protective layer material is preferable.

Examples of the material that forms the protective film 107 include the materials contained in the ink described above, the SOG materials, as well as the same materials as those exemplified in the description regarding the gate insulating film 103 above.

The thickness of the protective layer 107 is not limited, but is preferably from 50 nm to 5 μm, and more preferably from 500 nm to 3.0 μm.

Finally, the resin substrate 101 that is flexible is peeled from the temporary fixing substrate 100, thereby completing the organic thin-film transistor on a flexible substrate. A laser lift-off method (LLO) can be used as the method for peeling off the resin substrate 101 that is flexible. Alternatively, it is possible to form a release layer or a weak adhesive layer between the temporary fixing substrate 100 and the resin substrate 101 that is flexible with, for example, a fluorine-based polymer, a self-assembled monolayer (SAMs), or a week adhesive in advance, and then physically peel off the resin substrate 101 after completing the organic thin-film transistor. Of course, it is possible to first form the release layer or weak adhesive layer and then peel off the resin substrate 101 using LLO.

In this way, the organic thin-film transistor can be produced.

Because the ink composition according to an embodiment of the present invention uses Naphthalene Compound (A) as a solvent, it is possible to dissolve a high concentration of a solute (in particular, an organic semiconductor material) even at a relatively low temperature. Therefore, even in low temperatures (for example, from 20 to 50° C., preferably from 20 to 40° C.), it is possible to easily form an organic semiconductor device by a simple method using a wet process such as the edge-casting method and the continuous edge-casting method described above, significantly reducing the costs. In addition, the organic semiconductor device can be formed directly on an impact-resistant, lightweight, and flexible plastic substrate, although heat resistance of a plastic substrate is lower than that of a glass substrate, which allows to form an impact-resistant, lightweight, and flexible display or computer device. Furthermore, when the ink composition according to an embodiment of the present invention is applied onto a substrate, the solute contained in the composition (in particular, an organic semiconductor material) is crystallized via self-assembling action, and it is possible to obtain an organic semiconductor device having high carrier mobility (for example, greater than or equal to $0.1$ cm$^2$/Vs, preferably greater than or equal to $1.0$ cm$^2$/Vs, particularly preferably greater than or equal to $4.0$ cm$^2$/Vs, more preferably greater than or equal to $5.0$ cm$^2$/Vs, most preferably greater than or equal to than $7.0$ cm$^2$/Vs).

EXAMPLES

Hereinafter, the present invention will be described more specifically with reference to examples, but the present invention is not limited by these examples.

Manufacturing Example 1: Purification of 1-chloronaphthalene

Crude 1-chloronaphthalene (containing approximately 12.0% of 2-chloronaphthalene as an impurity) purchased from a reagent manufacturer was subjected to reduced-pressure distillation at a reflux ratio of 30 using an Oldershaw distillation apparatus; relative evaluations were performed in which the 2-chloronaphthalene contained was calculated as a percentage of area in gas chromatography with the 1-chloronaphthalene being 100%, and 1-chloronaphthalenes containing 3%, 1%, and 0.7% of 2-chloronaphthalene were prepared. The gas chromatography adopted an analytical method in which the undiluted solution was directly introduced under the following measurement conditions.

Device: GC-2014 (available from Shimadzu Corporation)
Column: HP-5; inner diameter: 0.32 mm; length: 60 m (available from Agirent)
Injection temperature: 250° C.
Detector temperature: 300° C.
Detector: FID
Carrier gas: He
Split ratio: 20:1
Temperature: from 150 to 250° C. (5° C./min)

Manufacturing Example 2: Purification of 1-Methylnaphthalene

Crude 1-methylnaphthalene (containing approximately 4.0% of 2-methylnaphthalene as an impurity) purchased from a reagent manufacturer was subjected to reduced-pressure distillation at a reflux ratio of 30 using an Oldershaw distillation apparatus; relative evaluations were performed in which the 2-methylnaphthalene contained was calculated as a percentage of area in gas chromatography with the 1-methylnaphthalene being 100%, and 1-methylnaphthalenes containing 3%, 1%, and 0.7% of 2-methylnaphthalene were prepared. The gas chromatography adopted an analytical method in which the undiluted solution was directly introduced under the same measurement conditions as those described in Manufacturing Example 1.

Example 1

When 0.03 wt % of N,N'-bis(2-phenylethyl)pyrene-3,4,9,10-dicarbodiimide, which is a compound represented by Formula (3-1) above, hereinafter referred to as Compound (3-1), acting as a solute, was mixed into 1-chloronaphthalene containing a relative percentage of 3% of 2-chloronaphthalene and dissolved by heating at 160° C., Compound (3-1) was completely dissolved. The obtained solution was subjected to application using the continuous edge-casting method illustrated in FIG. 2 to produce a single crystal. The produced single crystal was randomly sampled at 10 locations in a range of 10 mm×10 mm, observed with a polarizing microscope to observe the presence or absence of grain boundaries, and evaluated according to the following criteria.

⊚: Almost no grain boundaries are observed.
○: A few grain boundaries are observed.
Δ: Grain boundaries are observed.
x: A large number of grain boundaries are observed.

The results are shown in Table 1.

Example 2

When 0.03 wt % of Compound (3-1), acting as a solute, was mixed into 1-chloronaphthalene containing a relative percentage of 1% of 2-chloronaphthalene and dissolved by heating at 160° C., Compound (3-1) was completely dissolved. The obtained solution was subjected to application using the continuous edge-casting method illustrated in FIG. 2 to produce a single crystal. The produced single crystal was randomly sampled at 10 locations in a range of 10 mm×10 mm, observed with a polarizing microscope to observe the presence or absence of grain boundaries, and evaluated according to the criteria described above. The results are shown in Table 1.

Example 3

When 0.03 wt % of Compound (3-1), acting as a solute, was mixed into 1-chloronaphthalene containing a relative percentage of 0.7% of 2-chloronaphthalene and dissolved by heating at 160° C., Compound (3-1) was completely dissolved. The obtained solution was subjected to application using the continuous edge-casting method illustrated in FIG. 2 to produce a single crystal. The produced single crystal was randomly sampled at 10 locations in a range of 10 mm×10 mm, observed with a polarizing microscope to observe the presence or absence of grain boundaries, and evaluated according to the criteria described above. The results are shown in Table 1.

Example 4

When 0.03 wt % of Compound (3-1), acting as a solute, was mixed into 1-methylnaphthalene containing a relative percentage of 3% of 2-methylnaphthalene and dissolved by heating at 170° C., Compound (3-1) was completely dissolved. The obtained solution was subjected to application using the continuous edge-casting method illustrated in FIG. 2 to produce a single crystal. The produced single crystal was randomly sampled at 10 locations in a range of 10 mm×10 mm, observed with a polarizing microscope to observe the presence or absence of grain boundaries, and evaluated according to the criteria described above. The results are shown in Table 1.

Example 5

When 0.03 wt % of Compound (3-1), acting as a solute, was mixed into 1-methylnaphthalene containing a relative percentage of 1% of 2-methylnaphthalene and dissolved by heating at 170° C., Compound (3-1) was completely dissolved. The obtained solution was subjected to application using the continuous edge-casting method illustrated in FIG. 2 to produce a single crystal. The produced single crystal was randomly sampled at 10 locations in a range of 10 mm×10 mm, observed with a polarizing microscope to observe the presence or absence of grain boundaries, and evaluated according to the criteria described above. The results are shown in Table 1.

Example 6

When 0.03 wt % of Compound (3-1), acting as a solute, was mixed into 1-methylnaphthalene containing a relative percentage of 0.7% of 2-methylnaphthalene and dissolved by heating at 170° C., Compound (3-1) was completely dissolved. The obtained solution was subjected to application using the continuous edge-casting method illustrated in FIG. 2 to produce a single crystal. The produced single crystal was randomly sampled at 10 locations in a range of 10 mm×10 mm, observed with a polarizing microscope to observe the presence or absence of grain boundaries, and evaluated according to the criteria described above. The results are shown in Table 1.

TABLE 1

| EXAMPLES | Naphthalene Compound | Isomer Content (%) | Grain Boundary Evaluation |
|---|---|---|---|
| 1 | 1-chloronaphthalene | 3% | Δ (Marginal) |
| 2 |  | 1% | ○ (Good) |
| 3 |  | 0.7% | ◎ (Excellent) |
| 4 | 1-methylnaphthalene | 3% | Δ (Marginal) |
| 5 |  | 1% | ○ (Good) |
| 6 |  | 0.7% | ◎ (Excellent) |

It can be seen from the results of Table 1 that the lower the isomer content of the naphthalene compound, the less the grain boundaries, and the larger the single crystal grow.

Examples 7 to 12

Organic thin-film transistors as illustrated in FIG. 1 were produced using the solutions obtained in Examples 1 to 6. The resulting organic thin-film transistors and transistor characteristics were measured and evaluated according to the following criteria. The results are shown in Table 2.

◎: Carrier mobility is greater than or equal to 0.3 cm$^2$/Vs

○: Carrier mobility is 0.1 cm$^2$/Vs or above and less than 0.3 cm$^2$/Vs

Δ: Carrier mobility is 0.05 cm$^2$/Vs or above and less than 0.1 cm$^2$/Vs x: Carrier mobility is less than 0.05 cm$^2$/Vs

TABLE 2

| EXAMPLES | Naphthalene Compound | Isomer Content (%) | Semiconductor Performance Evaluation |
|---|---|---|---|
| 7 | 1-chloronaphthalene | 3% | Δ (Marginal) |
| 8 |  | 1% | ○ (Good) |
| 9 |  | 0.7% | ◎ (Excellent) |
| 10 | 1-methylnaphthalene | 3% | Δ (Marginal) |
| 11 |  | 1% | ○ (Good) |
| 12 |  | 0.7% | ◎ (Excellent) |

It can be seen from the results of Table 2 that the lower the isomer content of the naphthalene compound, the greater the carrier mobility, and the higher performance semiconductor is formed.

Variations of embodiments of the present invention described above are additionally described below.

[1] An ink composition for manufacturing an organic semiconductor device, the ink composition including at least one solvent selected from Naphthalene Compound (A) below and at least one solute:

Naphthalene Compound (A): a compound represented by Formula (a):

[Chem. 10]

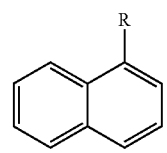

(a)

where in Formula (a), R represents a hydrogen atom, a halogen atom, a $C_{1-20}$ alkyl group which may have a substituent selected from Group 1, a $C_{2-22}$ alkenyl group which may have a substituent selected from Group 1, a $C_{2-22}$ alkynyl group which may have a substituent selected from Group 1, a $C_{1-20}$ alkoxy group which may have a substituent selected from Group 1, a $C_{1-20}$ alkylthio group which may have a substituent selected from Group 1, a $C_{2-20}$ alkylcarbonyl group which may have a substituent selected from Group 1, a $C_{2-20}$ alkoxycarbonyl group which may have a substituent selected from Group 1, a di- or mono-$C_{1-20}$ alkylamino group which may have a substituent selected from Group 1, a $C_{6-20}$ aryl group which may have a substituent selected from Group 2, a monovalent heterocyclic group which may have a substituent selected from Group 2, or a $C_{3-20}$ cycloalkyl group which may have a substituent selected from Group 2;

Group 1 mentioned above includes a halogen atom, a sulfonyl group, a hydroxy group, an aldehyde group (—CHO), a carbonyl group, a carboxyl group, a nitro group, an amino group, a sulfo group (—$SO_3H$), an ether group, a $C_{1-20}$ alkylthio group, a di- or mono-$C_{1-20}$ alkylamino group, a $C_{6-20}$ aryl group, a monovalent heterocyclic group, and a $C_{3-20}$ substituted silyl group;

Group 2 mentioned above includes a substituent selected from Group 1, a $C_{1-20}$ alkyl group which may have a substituent selected from Group 1, a $C_{2-20}$ alkenyl group which may have a substituent selected from Group 1, and a $C_{2-20}$ alkynyl group which may have a substituent selected from Group 1.

[2] The ink composition for manufacturing an organic semiconductor device according to [1], wherein R is a halogen atom or a $C_{1-20}$ alkyl group which may have a substituent selected from Group 1.

[3] The ink composition for manufacturing an organic semiconductor device according to [1] or [2], wherein Naphthalene Compound (A) is at least one selected from the group consisting of 1-chloronaphthalene and 1-methylnaphthalene.

[4] The ink composition for manufacturing an organic semiconductor device according to any one of [1] to [3], wherein an isomer content of Naphthalene Compound (A) in terms of a percentage for peak area with Naphthalene Compound (A) being 100% in gas chromatography is 2% or less (for example, 1.8% or less, 1.5% or less, 1.2% or less, 1% or less, or 0.8% or less).

[5] The ink composition for manufacturing an organic semiconductor device according to [4], wherein an isomer of Naphthalene Compound (A) is a Naphthalene Compound (A') represented by Formula (a') above.

[6] The ink composition for manufacturing an organic semiconductor device according to any one of [1] to [5], wherein a molecular weight of Naphthalene Compound (A) is 250 or less (for example, from 128 to 200, or from 130 to 180).

[7] The ink composition for manufacturing an organic semiconductor device according to any one of [1] to [6], wherein a boiling point of Naphthalene Compound (A) is 300° C. or below, (for example, from 200 to 300° C., or from 210 to 280° C.).

[8] The ink composition for manufacturing an organic semiconductor device according to any one of [1] to [7], wherein an SP value of Naphthalene Compound (A) by Fedors method at 25° C. is from 7.0 to 12.0 [(cal/cm$^3$)0.5] (for example, from 8.0 to 12.0 [(cal/cm$^3$)0.5], or from 9.0 to 11.5 [(cal/cm$^3$)0.5]).

[9] The ink composition for manufacturing an organic semiconductor device according to any one of [1] to [8], wherein a content ratio of Naphthalene Compound (A) in a total amount of solvent (100 wt. %) is 50 wt. % or above (for example, 70 wt. % or above, or 80 wt. % or above).

[10] The ink composition for manufacturing an organic semiconductor device according to any one of [1] to [9], wherein the solute is an organic semiconductor material.

[11] The ink composition for manufacturing an organic semiconductor device according to any one of [1] to [10], wherein the solute is an n-type organic semiconductor material.

[12] The ink composition for manufacturing an organic semiconductor device according to [11], wherein the n-type organic semiconductor material is a compound represented by Formula (3) above.

[13] The ink composition for manufacturing an organic semiconductor device according to [11], wherein the n-type organic semiconductor material is at least one compound selected from the group consisting of compounds represented by Formulas (3-1) to (3-5) above.

[14] The ink composition for manufacturing an organic semiconductor device according to [11], wherein the n-type organic semiconductor material is at least one compound selected from the group consisting of a compound represented by Formula (4) above and a compound represented by Formula (5) above.

[15] The ink composition for manufacturing an organic semiconductor device according to any one of [1] to [14], wherein the solute is a p-type organic semiconductor material.

[16] The ink composition for manufacturing an organic semiconductor device according to [15], wherein the p-type organic semiconductor material is at least one compound selected from the group consisting of a compound represented by Formula (1-1) above and a compound represented by Formula (1-2) above.

[17] The ink composition for manufacturing an organic semiconductor device according to [15], wherein the p-type organic semiconductor material is a compound represented by Formula (2) above.

[18] The ink composition for manufacturing an organic semiconductor device according to [15], wherein the p-type organic semiconductor material is at least one compound selected from the group consisting of compounds represented by Formulas (2-1) to (2-5) above.

[19] The ink composition for manufacturing an organic semiconductor device according to any one of [1] to [18], the ink composition further including a macromolecular compound as a second component in addition to the solute.

[20] The ink composition for manufacturing an organic semiconductor device according to [19], wherein the macromolecular compound is at least one macromolecular compound selected from the group consisting of epoxy resins, acrylic resins, polystyrene resins, cellulose resins, and butyral resins.

[21] The ink composition for manufacturing an organic semiconductor device according to [19] or [20], wherein a content of the macromolecular compound per 100 wt. % of the ink composition is from 0.01 to 20 wt. % (for example, from 0.1 to 10 wt. %).

[22] The ink composition for manufacturing an organic semiconductor device according to any one of [1] to [21], wherein a content of Naphthalene Compound (A) in a total amount of the ink composition is 99.999 wt. % or less (the lower limit is, for example, 90.000 wt. %, 93.000 wt. %, or 95.000 wt. %, while the upper limit is, for example, 99.990 wt. %).

[22] The ink composition for manufacturing an organic semiconductor device according to any one of [1] to [21], wherein a content of the solute per 100 parts by weight of Naphthalene Compound (A) is 0.02 parts by weight or more (for example, 0.03 parts by weight or more, or 0.04 parts by weight or more) and 1 part by weight or less (for example, 0.5 parts by weight or less, or 0.1 parts by weight or less).

[23] The ink composition for manufacturing an organic semiconductor device according to any one of [1] to [22], wherein the ink composition is used for producing an organic single-crystal semiconductor film by a drop-casting method, an inkjet printing method, an edge-casting method, or a continuous edge-casting method.

INDUSTRIAL APPLICABILITY

By manufacturing an organic single-crystal transistor using the ink composition for manufacturing an organic semiconductor device according to an embodiment of the present invention, it is possible to obtain high-performance organic thin-film transistors efficiently at a low cost. In particular, by using the subject ink composition in a drop-casting method, an inkjet printing method, an edge-casting method, or a continuous edge-casting method, it is possible to maximize the performance of semiconductor materials.

REFERENCE SIGNS LIST

100 Temporary fixing substrate for handling
101 Resin substrate
102 Conductive thin film (gate electrode)
103 Gate insulating film
104 Organic single-crystal semiconductor film
105 Conductive thin film (source electrode, drain electrode)
106 Charge injection layer for ohmic contact formation
107 Protective layer
200 Substrate stage for placing a substrate on a continuous edge-casting apparatus
201 Slit for continuous edge-casting application and ink supply
202 Ink tank
203 Meniscus for an ink composition for manufacturing an organic device formed between a slit and a substrate

The invention claimed is:

1. An ink composition for manufacturing an organic semiconductor device, the ink composition comprising at least one solvent selected from Naphthalene Compound (A) below and at least one solute,
  wherein an isomer content of Naphthalene Compound (A) is 0.7% to 2% in terms of a percentage for peak area with Naphthalene Compound (A) being 100% in gas chromatography, and
  the isomer comprises Naphthalene Compound (A') below:
  Naphthalene Compound (A): a compound represented by Formula (a):

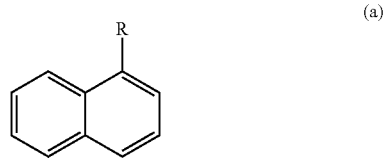

where in Formula (a), R represents a hydrogen atom, a halogen atom, a $C_{1-20}$ alkyl group which may have a substituent selected from Group 1, a $C_{2-22}$ alkenyl group which may have a substituent selected from Group 1, a $C_{2-22}$ alkynyl group which may have a substituent selected from Group 1, a $C_{1-20}$ alkoxy group which may have a substituent selected from Group 1, a $C_{1-20}$ alkylthio group which may have a substituent selected from Group 1, a $C_{2-20}$ alkylcarbonyl group which may have a substituent selected from Group 1, a $C_{2-20}$ alkoxycarbonyl group which may have a substituent selected from Group 1, a di- or mono-$C_{1-20}$ alkylamino group which may have a substituent selected from Group 1, a $C_{6-20}$ aryl group which may have a substituent selected from Group 2, a monovalent heterocyclic group which may have a substituent selected from Group 2, or a $C_{3-20}$ cycloalkyl group which may have a substituent selected from Group 2;
  Group 1 mentioned above includes a halogen atom, a sulfonyl group, a hydroxy group, an aldehyde group (—CHO), a carbonyl group, a carboxyl group, a nitro group, an amino group, a sulfo group (—$SO_3H$), an ether group, a $C_{1-20}$ alkylthio group, a di- or mono-$C_{1-20}$ alkylamino group, a $C_{6-20}$ aryl group, a monovalent heterocyclic group, and a $C_{3-20}$ substituted silyl group; and
  Group 2 mentioned above includes a substituent selected from Group 1, a $C_{1-20}$ alkyl group which may have a substituent selected from Group 1, a $C_{2-20}$ alkenyl group which may have a substituent selected from Group 1, and a $C_{2-20}$ alkynyl group which may have a substituent selected from Group 1,
  Naphthalene Compound (A'): a compound represented by Formula (a'):

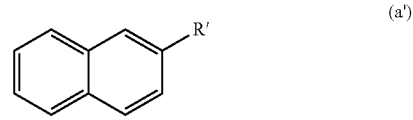

where in Formula (a'), R' is the same as R in Formula (a) above.

2. The ink composition for manufacturing an organic semiconductor device according to claim 1, wherein R is a halogen atom or a $C_{1-20}$ alkyl group which may have a substituent selected from Group 1.

3. The ink composition for manufacturing an organic semiconductor device according to claim 1, wherein Naphthalene Compound (A) is at least one selected from the group consisting of 1-chloronaphthalene and 1-methylnaphthalene.

4. The ink composition for manufacturing an organic semiconductor device according to claim 1, wherein the solute is an organic semiconductor material.

5. The ink composition for manufacturing an organic semiconductor device according to claim 1, wherein the solute is an n-type organic semiconductor material.

6. The ink composition for manufacturing an organic semiconductor device according to claim 1, the ink composition further comprising a macromolecular compound as a second component in addition to the solute.

7. A method for producing an organic single-crystal semiconductor film, comprising:
  applying the ink composition for manufacturing an organic semiconductor device according to claim 1 to a surface of a substrate by a drop-casting method, an inkjet printing method, an edge-casting method, or a continuous edge-casting method to form the organic single-crystal semiconductor film.

* * * * *